US012002626B2

(12) United States Patent
Sato

(10) Patent No.: US 12,002,626 B2
(45) Date of Patent: Jun. 4, 2024

(54) MULTI-LAYER CERAMIC ELECTRONIC COMPONENT, MULTI-LAYER CERAMIC ELECTRONIC COMPONENT MOUNTING SUBSTRATE, MULTI-LAYER CERAMIC ELECTRONIC COMPONENT PACKAGE, AND METHOD OF PRODUCING A MULTI-LAYER CERAMIC ELECTRONIC COMPONENT

(71) Applicant: Taiyo Yuden Co., Ltd., Tokyo (JP)

(72) Inventor: Hiroaki Sato, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 17/452,046

(22) Filed: Oct. 22, 2021

(65) Prior Publication Data

US 2022/0044874 A1  Feb. 10, 2022

Related U.S. Application Data

(63) Continuation of application No. 16/912,026, filed on Jun. 25, 2020, which is a continuation of application
(Continued)

(30) Foreign Application Priority Data

Aug. 23, 2018  (JP) ................................. 2018-156573

(51) Int. Cl.
*H01G 4/012* (2006.01)
*H01G 4/12* (2006.01)
(Continued)

(52) U.S. Cl.
CPC .............. *H01G 4/30* (2013.01); *H01G 4/012* (2013.01); *H01G 4/12* (2013.01); *H01G 4/248* (2013.01);
(Continued)

(58) Field of Classification Search
CPC ........... H01G 2/06; H01G 4/012; H01G 4/12; H01G 4/232; H01G 4/248; H01G 4/30;
(Continued)

(56) References Cited

U.S. PATENT DOCUMENTS

| 2001/0019176 A1 | 9/2001 | Ahiko |
| 2003/0016484 A1* | 1/2003 | Iwaida .................. C04B 35/634 29/25.42 |

(Continued)

FOREIGN PATENT DOCUMENTS

| CN | 1423288 A | 6/2003 |
| CN | 104112591 A | 10/2014 |

(Continued)

OTHER PUBLICATIONS

Office Action dated May 27, 2022 in Japanese Application No. 2018-156573.
(Continued)

*Primary Examiner* — Timothy J Thompson
*Assistant Examiner* — Guillermo J Egoavil
(74) *Attorney, Agent, or Firm* — SALIWANCHIK, LLOYD & EISENSCHENK

(57) ABSTRACT

A multi-layer ceramic electronic component includes: a ceramic body including internal electrodes laminated in a first direction, a first main surface including a first flat region facing in the first direction, and a second main surface including a second flat region facing in the first direction; and a pair of external electrodes connected to the internal electrodes and facing each other in a second direction orthogonal to the first direction, a dimension of the ceramic body in the first direction being 1.1 times or more and 1.6 times or less a dimension of the ceramic body in a third direction orthogonal to the first and second directions, the first flat region being formed at a center portion of the first
(Continued)

main surface in the second direction, the second flat region being formed at a center portion of the second main surface in the third direction.

7 Claims, 16 Drawing Sheets

Related U.S. Application Data

No. 16/536,896, filed on Aug. 9, 2019, now Pat. No. 10,854,392.

(51) Int. Cl.
  *H01G 4/248* (2006.01)
  *H01G 4/30* (2006.01)
  *H05K 1/18* (2006.01)
(52) U.S. Cl.
  CPC ... *H05K 1/181* (2013.01); *H05K 2201/10015* (2013.01)
(58) Field of Classification Search
  CPC ........ H05K 1/181; H05K 1/18; H05K 3/3442; H05K 2201/10015; Y02P 70/50
  USPC ...... 174/260; 361/321.2, 301.4, 321.5, 321.4
  See application file for complete search history.

(56) References Cited

U.S. PATENT DOCUMENTS

| | | | |
|---|---|---|---|
| 2007/0058326 A1* | 3/2007 | Hidaka | H01G 4/12 361/311 |
| 2010/0271752 A1* | 10/2010 | Ishida | H01G 4/012 361/306.3 |
| 2012/0140377 A1* | 6/2012 | Kim | H01G 4/30 361/321.2 |
| 2012/0257322 A1 | 10/2012 | Shiota | |
| 2014/0009038 A1* | 1/2014 | Matsuda | B41J 2/1646 310/365 |
| 2014/0043723 A1 | 2/2014 | Hattori et al. | |
| 2014/0307362 A1 | 10/2014 | Kim et al. | |
| 2015/0075854 A1* | 3/2015 | You | H01G 4/35 361/275.1 |
| 2015/0116896 A1 | 4/2015 | Inazuka et al. | |
| 2015/0116901 A1* | 4/2015 | Sasaoka | H01C 7/008 361/301.4 |
| 2015/0122537 A1 | 5/2015 | Yamada | |
| 2015/0228409 A1 | 8/2015 | Fujita et al. | |
| 2016/0049245 A1 | 2/2016 | Kitano et al. | |
| 2018/0061670 A1 | 3/2018 | Ishida | |
| 2018/0374645 A1 | 12/2018 | Imai | |
| 2019/0198249 A1* | 6/2019 | Sato | H01G 2/06 |
| 2020/0066455 A1 | 2/2020 | Sato | |
| 2021/0313113 A1 | 10/2021 | Hirao | |
| 2023/0162925 A1* | 5/2023 | Sato | H01G 4/232 361/301.4 |

FOREIGN PATENT DOCUMENTS

| | | | | |
|---|---|---|---|---|
| JP | 1-187901 A | 7/1989 | | |
| JP | 9-129482 A | 5/1997 | | |
| JP | 11-40459 A | 2/1999 | | |
| JP | 2000-12378 A | 1/2000 | | |
| JP | 2000-195741 A | 7/2000 | | |
| JP | 2002-353625 A | 12/2002 | | |
| JP | 2004253431 A | * 9/2004 | ............... H05K 3/46 | |
| JP | 2006-310700 A | 11/2006 | | |
| JP | 2014-212295 A | 11/2014 | | |
| JP | 2015-026841 A | 2/2015 | | |
| JP | 2015-61074 A | 3/2015 | | |
| JP | 2015-188111 A | 10/2015 | | |
| JP | 2016-82033 A | 5/2016 | | |

OTHER PUBLICATIONS

Office Action dated Nov. 22, 2021 in Japanese Application No. 2018-156573.
Office Action dated Nov. 18, 2021 in U.S. Appl. No. 16/912,026.
Office Action dated Jan. 18, 2022 in Chinese Application No. 201910767525.0.
Office Action dated Mar. 27, 2020 in U.S. Appl. No. 16/536,896.
TDK_MLCC_pp. 1-6_Mar. 2018.
Office Action dated Jul. 22, 2021 in U.S. Appl. No. 16/912,026.
Notice of Allowance dated Aug. 5, 2020 in U.S. Appl. No. 16/536,896.
Office Action dated Jun. 16, 2022 in U.S. Appl. No. 16/912,026.
Office Action dated Feb. 25, 2022 in U.S. Appl. No. 16/912,026.
Office Action dated Sep. 21, 2022 in Chinese Application No. 201910767525.0.
Notice of Allowance dated Dec. 21, 2022 in U.S. Appl. No. 16/912,026.
Office Action dated Nov. 22, 2022 in Japanese Application No. 2018-156573.
Office Action dated May 16, 2023 in Japanese Application No. 2018-156573.
Office Action dated Apr. 27, 2023 in Chinese Application No. 201910767525.0.
Office Action dated Feb. 8, 2024 in Chinese Application No. 201910767525.0.
Decision of Reexamination dated Apr. 3, 2024 in Chinese Application No. 201910767525.0.

* cited by examiner

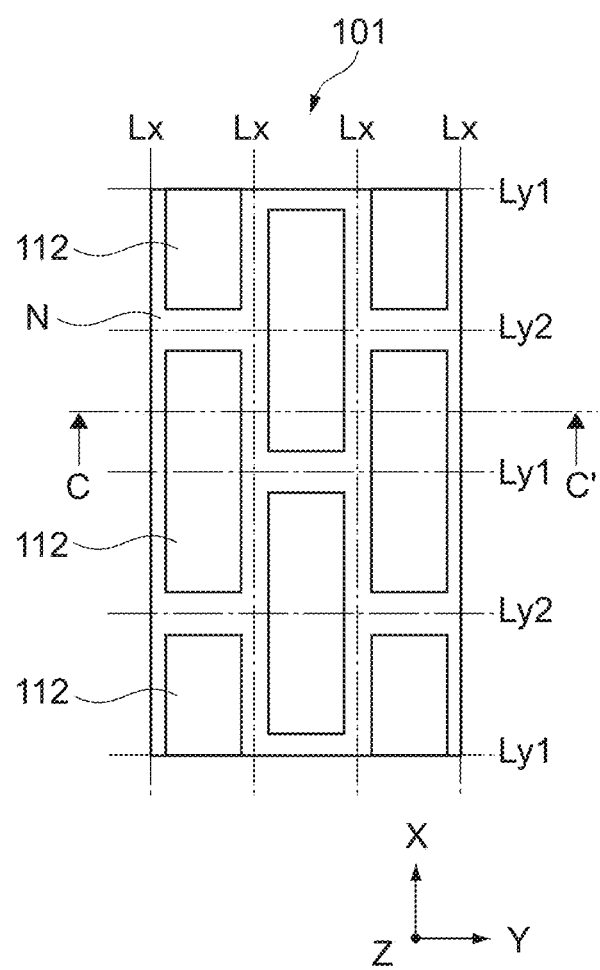
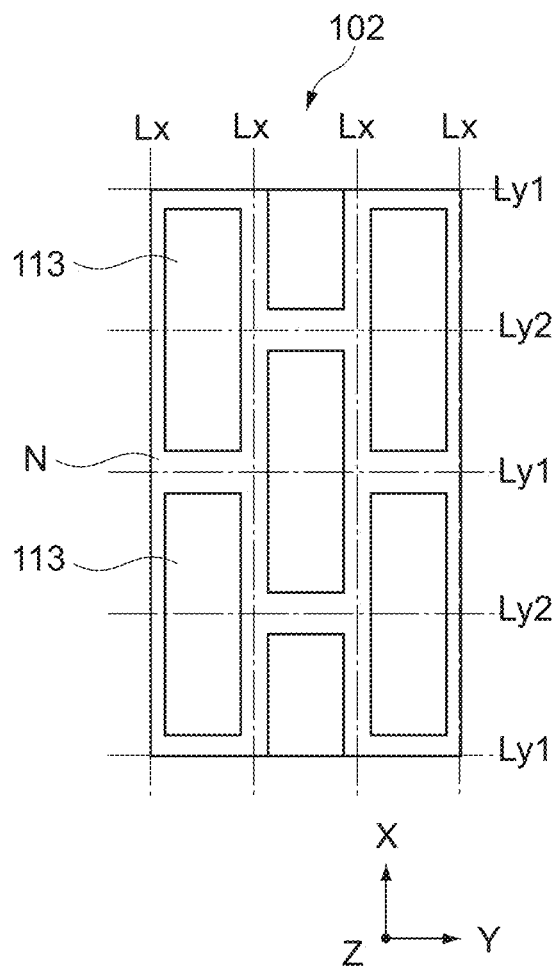
FIG.8A  FIG.8B
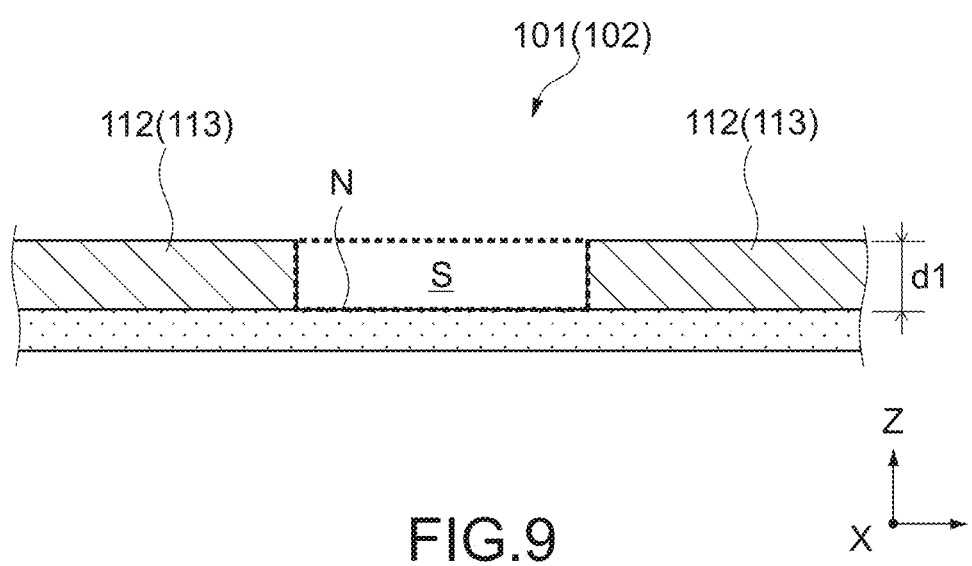
FIG.9

MULTI-LAYER CERAMIC ELECTRONIC COMPONENT, MULTI-LAYER CERAMIC ELECTRONIC COMPONENT MOUNTING SUBSTRATE, MULTI-LAYER CERAMIC ELECTRONIC COMPONENT PACKAGE, AND METHOD OF PRODUCING A MULTI-LAYER CERAMIC ELECTRONIC COMPONENT

CROSS-REFERENCE TO RELATED APPLICATIONS

This application is a continuation of U.S. application Ser. No. 16/912,026, filed Jun. 25, 2020; which is a continuation of U.S. application Ser. No. 16/536,896, filed Aug. 9, 2019, now U.S. Pat. No. 10,854,392, issued Dec. 1, 2020; which claims the benefit of Japanese Priority Patent Application No. 2018-156573, filed Aug. 23, 2018, the entire contents of which are incorporated herein by reference.

BACKGROUND

The present disclosure relates to a multi-layer ceramic electronic component such as a multi-layer ceramic capacitor, a multi-layer ceramic electronic component mounting substrate and a multi-layer ceramic electronic component package that mount the multi-layer ceramic electronic component, and a method of producing a multi-layer ceramic electronic component.

In the past, a multi-layer ceramic electronic component such as a multi-layer ceramic capacitor, in which a ceramic body includes a plurality of laminated internal electrodes, has been known. The multi-layer ceramic electronic component is mounted onto a circuit board of a personal digital assistant or another electronic device and widely used.

Japanese Patent Application Laid-open No. 2015-026841 discloses a multi-layer ceramic capacitor including an element body. The element body includes a laminated part configured by alternately laminating a plurality of conductor layers and a plurality of ceramic dielectric layers and has a shape in which two main surfaces protrude outward such that the thickness of the element body becomes largest at the center portion in the length direction and becomes smallest at both end portions in the length direction and such that the thickness of the element body becomes largest at the center portion in the width direction and becomes smallest at both end portions in the width direction.

SUMMARY

In recent years, electronic devices such as personal digital assistants have increasingly achieved downsizing, and a mounting area for ceramic electronic components on a circuit board is limited. Meanwhile, there is a demand for improvement in electrical characteristics of multi-layer ceramic electronic components, such as increase in capacitance of multi-layer ceramic capacitors.

In view of the circumstances as described above, it is desirable to provide a multi-layer ceramic electronic component, a multi-layer ceramic electronic component mounting substrate, a multi-layer ceramic electronic component package, and a method of producing a multi-layer ceramic electronic component, which are capable of improving electrical characteristics without increasing a mounting area on a circuit board.

According to an embodiment of the present disclosure, there is provided a multi-layer ceramic electronic component including a ceramic body and a pair of external electrodes.

The ceramic body includes internal electrodes laminated in a first direction, a first main surface including a first flat region facing in the first direction, and a second main surface including a second flat region, the second flat region being on a side opposite to the first flat region and facing in the first direction.

The pair of external electrodes are connected to the internal electrodes and face each other in a second direction orthogonal to the first direction.

A dimension of the ceramic body in the first direction is 1.1 times or more and 1.6 times or less a dimension of the ceramic body in a third direction orthogonal to the first direction and the second direction.

The first flat region is formed at a center portion of the first main surface in the second direction.

The second flat region is formed at a center portion of the second main surface in the third direction.

With this configuration, it is possible to increase the height of the ceramic body while maintaining the areas of the main surfaces and to increase the number of laminated internal electrodes. Therefore, it is possible to achieve a multi-layer ceramic electronic component capable of improving electrical characteristics without increasing a mounting area on a circuit board.

Additionally, the ceramic body includes the first flat region formed at the center portion of the first main surface in the second direction. Accordingly, a suction nozzle for transferring the multi-layer ceramic electronic component at the time of mounting can come into close contact with the first flat region and can stably hold the first flat region. Therefore, it is possible to inhibit a failure at the time of mounting from occurring in the multi-layer ceramic electronic component. In addition, the ceramic body includes the second flat region formed at the center portion of the second main surface in the third direction. Accordingly, the multi-layer ceramic electronic component can be inhibited from being inclined when the multi-layer ceramic electronic component is disposed onto a circuit board and in a soldering step. Therefore, it is possible to mount the multi-layer ceramic electronic component and another electronic component at high density.

A dimension of the first flat region in the third direction may be 80% or more and less than 100% of the dimension of the ceramic body in the third direction.

Further, a dimension of the second flat region in the second direction may be 80% or more and less than 100% of a dimension of the ceramic body in the second direction.

Accordingly, it is possible to further increase the stability of suction at the time of mounting of the multi-layer ceramic electronic component and the stability of a posture of the multi-layer ceramic electronic component on the circuit board and to more reliably inhibit occurrence of a failure.

According to another embodiment of the present disclosure, there is provided a multi-layer ceramic electronic component mounting substrate including a circuit board and a multi-layer ceramic electronic component.

The multi-layer ceramic electronic component includes a ceramic body including internal electrodes laminated in a first direction, and a pair of external electrodes connected to the internal electrodes and facing each other in a second direction orthogonal to the first direction, the multi-layer ceramic electronic component being mounted onto the circuit board via the pair of external electrodes.

A dimension of the ceramic body in the first direction is 1.1 times or more and 1.6 times or less a dimension of the ceramic body in a third direction orthogonal to the first direction and the second direction.

The ceramic body includes a first main surface including a first flat region facing in the first direction, and a second main surface including a second flat region, the second flat region being on a side opposite to the first flat region and facing in the first direction.

The first flat region is formed at a center portion of the first main surface in the second direction.

The second flat region is formed at a center portion of the second main surface in the third direction.

The multi-layer ceramic electronic component is mounted onto the circuit board such that the second flat region faces the circuit board in the first direction and that the first flat region faces upward in the first direction.

Additionally, the multi-layer ceramic electronic component mounting substrate may further include multi-layer ceramic electronic components each including the ceramic body and the pair of external electrodes.

In this case, the multi-layer ceramic electronic components are to be mounted onto the circuit board along the third direction at intervals of 30% or less of the dimension of the ceramic body in the third direction.

The multi-layer ceramic electronic component configured as described above includes the flat region on each of the first main surface and the second main surface, and can thus increase the stability of the posture of the multi-layer ceramic electronic component at the time of mounting. Accordingly, it is possible to mount the multi-layer ceramic electronic components on the circuit board at high density.

The multi-layer ceramic electronic component is placed onto the circuit board with the first flat region formed at the center portion in the second direction being held by suction by a suction nozzle in the first direction. Accordingly, in the multi-layer ceramic electronic component mounting substrate, the multi-layer ceramic electronic component is mounted onto the circuit board such that the first flat region formed at the center portion in the second direction faces upward in the first direction and that the second flat region formed at the center portion in the third direction faces downward in the first direction.

According to still another embodiment of the present disclosure, there is provided a multi-layer ceramic electronic component package including a multi-layer ceramic electronic component, a housing portion, and a sealing portion.

The multi-layer ceramic electronic component includes a ceramic body and a pair of external electrodes and is to be mounted onto a circuit board via the pair of external electrodes.

The ceramic body includes internal electrodes laminated in a first direction, a first main surface including a first flat region facing in the first direction, and a second main surface including a second flat region, the second flat region being on a side opposite to the first flat region and facing in the first direction.

The pair of external electrodes are connected to the internal electrodes and face each other in a second direction orthogonal to the first direction.

A dimension of the ceramic body in the first direction is 1.1 times or more and 1.6 times or less a dimension of the ceramic body in a third direction orthogonal to the first direction and the second direction.

The first flat region is formed at a center portion of the first main surface in the second direction.

The second flat region is formed at a center portion of the second main surface in the third direction.

The housing portion includes a recess that houses the multi-layer ceramic electronic component and that includes a take-out opening.

The sealing portion covers the take-out opening of the recess.

The multi-layer ceramic electronic component is housed in the recess with the first flat region being faced to the take-out opening.

With this configuration, when the sealing portion is peeled off, the first flat region is to be exposed from the take-out opening. Therefore, it is possible to cause the suction nozzle to come into close contact with the first flat region without changing the posture of the multi-layer ceramic electronic component, and smoothly mount the multi-layer ceramic electronic component.

According to yet still another embodiment of the present disclosure, there is provided a method of producing a multi-layer ceramic electronic component, the method including: forming an internal electrode pattern having a predetermined thickness on an unsintered ceramic sheet; forming a dielectric pattern in an electrode non-formation region around the internal electrode pattern on the ceramic sheet such that the dielectric pattern occupies 75% or more and less than 100% of a space portion facing the electrode non-formation region and having the predetermined thickness; laminating in a first direction the ceramic sheets on each of which the internal electrode pattern and the dielectric pattern are formed, and thereby forming a ceramic body including a plurality of internal electrodes laminated in the first direction; and forming a pair of external electrodes that are connected to the plurality of internal electrodes and face each other in a second direction orthogonal to the first direction, a dimension of the ceramic body in the first direction being 1.1 times or more and 1.6 times or less a dimension of the ceramic body in a third direction orthogonal to the first direction and the second direction.

Accordingly, not only the internal electrode pattern but also the dielectric pattern are formed on each ceramic sheet. When the dielectric pattern is formed to occupy 75% or more of the space portion, the laminated ceramic sheets can be inhibited from sinking down into gaps between the internal electrode patterns and the dielectric patterns. Accordingly, also in a ceramic body including a lot of laminated ceramic sheets, variations in height dimension for each region can be suppressed, and the flat region can be formed on each of the first main surface and the second main surface. Further, when the dielectric pattern is formed to be less than 100% of the space portion, it is possible to inhibit the dielectric pattern from overlapping with the internal electrode pattern if the dielectric pattern is slightly displaced with respect to the internal electrode pattern. This can also suppress variations in height dimension in the ceramic body and form the flat region.

As described above, according to the present disclosure, it is possible to provide a multi-layer ceramic electronic component, a multi-layer ceramic electronic component mounting substrate, a multi-layer ceramic electronic component package, and a method of producing a multi-layer ceramic electronic component, which are capable of improving electrical characteristics without increasing a mounting area on a circuit board.

These and other objects, features and advantages of the present disclosure will become more apparent in light of the following detailed description of embodiments thereof, as illustrated in the accompanying drawings.

BRIEF DESCRIPTION OF DRAWINGS

FIGS. 8A and 8B are each a plan view showing a production process of the multi-layer ceramic capacitor;

FIG. 9 is a partial cross-sectional view of the multi-layer ceramic capacitor taken along the C-C' line of FIG. 8A;

DETAILED DESCRIPTION OF EMBODIMENTS

Hereinafter, an embodiment of the present disclosure will be described with reference to the drawings.

In the figures, an X axis, a Y axis, and a Z axis orthogonal to one another are shown as appropriate. The X axis, the Y axis, and the Z axis are common in all figures.

1. Basic Configuration of Multi-Layer Ceramic Capacitor 10

Figure 1:
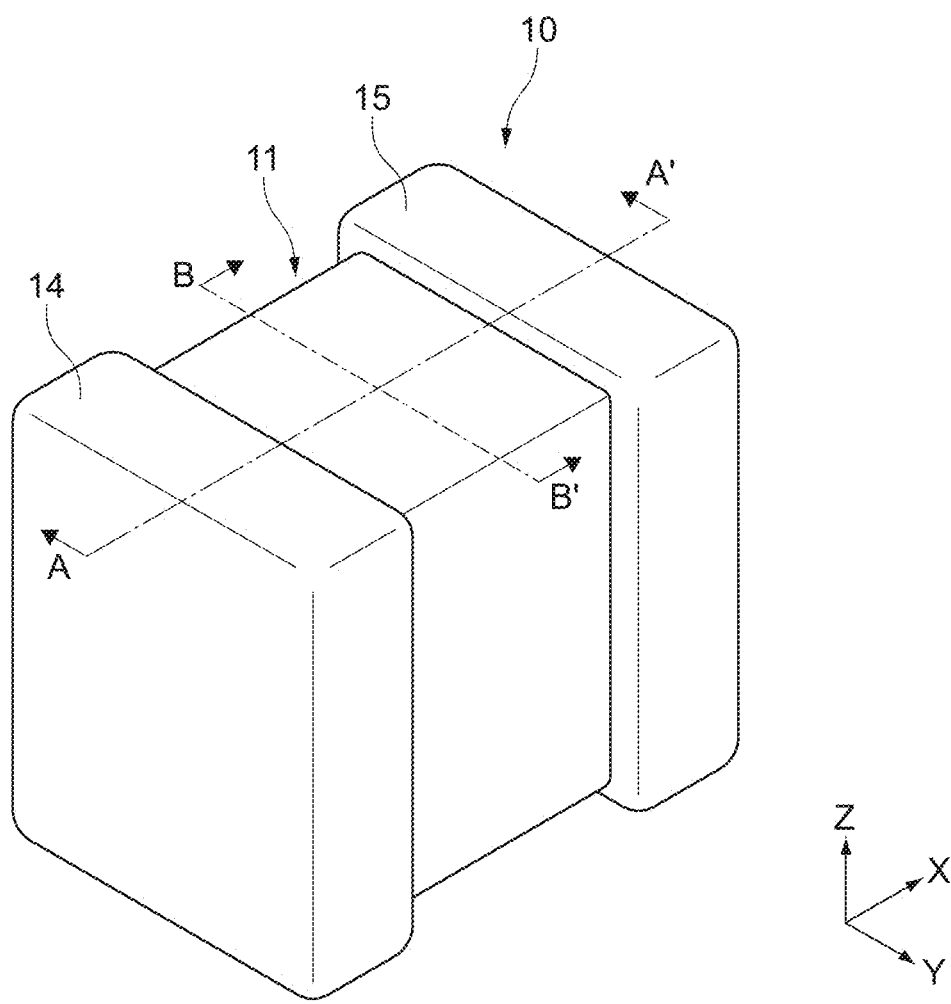
FIG. 1 is a perspective view of a multi-layer ceramic capacitor according to an embodiment of the present disclosure.
Figure 2:
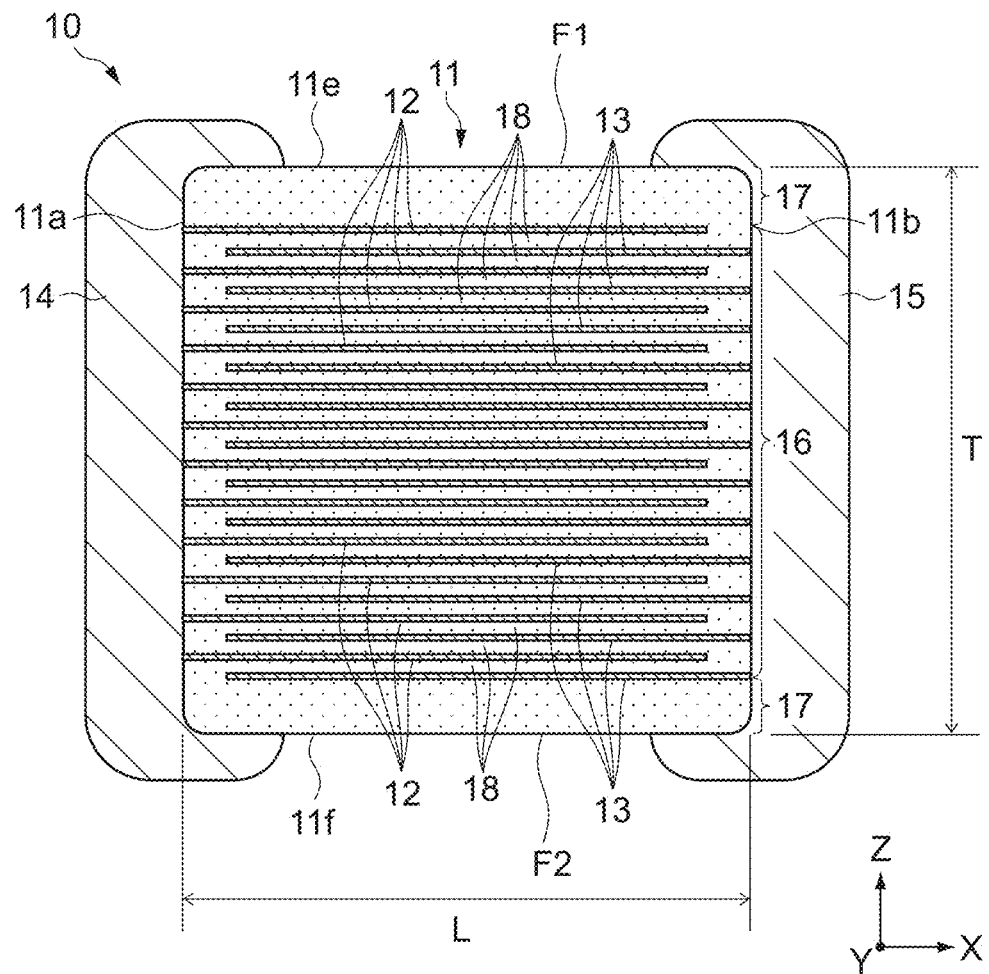
FIG. 2 is a cross-sectional view of the multi-layer ceramic capacitor taken along the A-A' line in FIG. 1.
Figure 3:
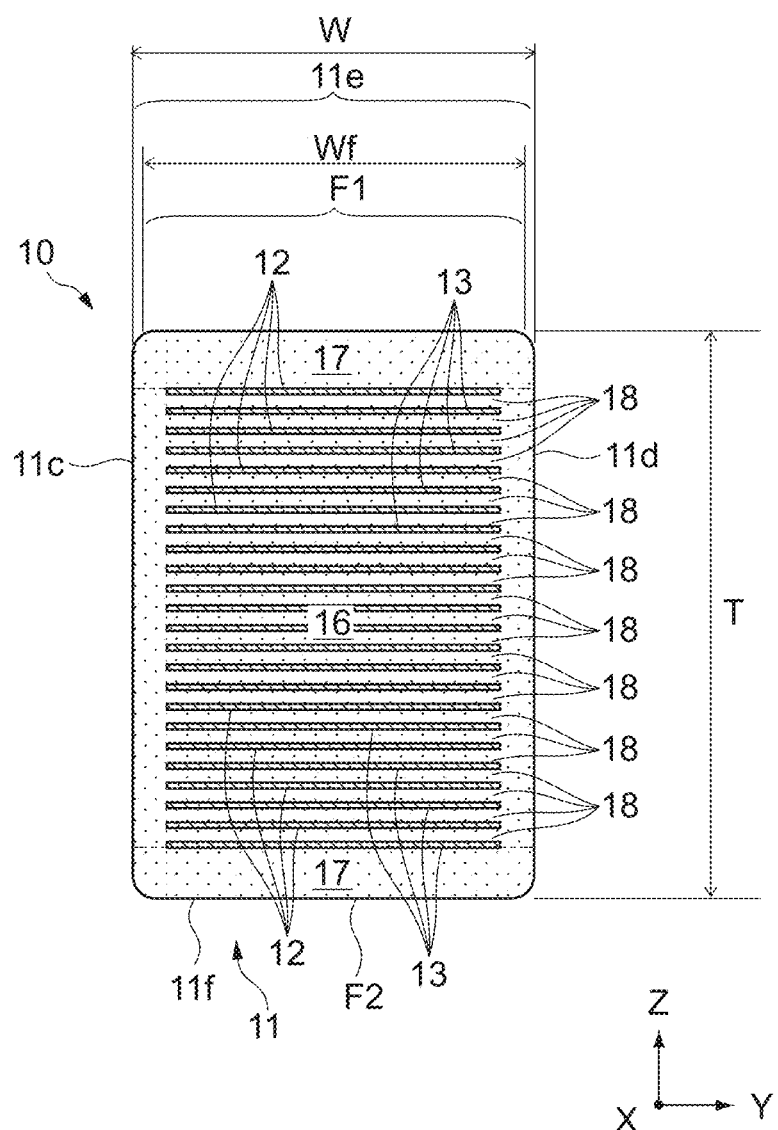
FIG. 3 is a cross-sectional view of the multi-layer ceramic capacitor taken along the B-B' line in FIG. 1.

FIGS. 1 to 3 each show a multi-layer ceramic capacitor 10 according to an embodiment of the present disclosure. FIG. 1 is a perspective view of the multi-layer ceramic capacitor 10. FIG. 2 is a cross-sectional view of the multi-layer ceramic capacitor 10 taken along the A-A' line in FIG. 1. FIG. 3 is a cross-sectional view of the multi-layer ceramic capacitor 10 taken along the B-B' line in FIG. 1.

The multi-layer ceramic capacitor 10 includes a ceramic body 11, a first external electrode 14, and a second external electrode 15.

Typically, the ceramic body 11 has two end surfaces 11a and 11b facing in an X-axis direction, two side surfaces 11c and 11d facing in a Y-axis direction, and two main surfaces 11e and 11f facing in a Z-axis direction. Ridges connecting the respective surfaces of the ceramic body 11 are chamfered.

It should be noted that the shape of the ceramic body 11 is not limited to the above shape. In other words, the ceramic body 11 does not need to have the rectangular shape as shown in FIGS. 1 to 3.

The first external electrode 14 and the second external electrode 15 are configured to face each other in the X-axis direction and to respectively cover both the end surfaces 11a and 11b of the ceramic body 11. The first external electrode 14 and the second external electrode 15 extend to the four surfaces connected to both the end surfaces 11a and 11b, i.e., the two main surfaces 11e and 11f and the two side surfaces 11c and 11d. With this configuration, both of the first external electrode 14 and the second external electrode 15 have U-shaped cross sections parallel to the X-Z plane and the X-Y plane.

The ceramic body 11 includes a multi-layer unit 16 and covers 17. The multi-layer unit 16 has a configuration in which first internal electrodes 12 and second internal electrodes 13 are alternately laminated in the Z-axis direction via ceramic layers 18. The covers 17 cover an upper surface and a lower surface of the multi-layer unit 16 in the Z-axis direction.

The first internal electrodes 12 and the second internal electrodes 13 are alternately laminated in the Z-axis direction via the ceramic layers 18. The first internal electrodes 12 are drawn to the end surface 11a to be connected to the first external electrode 14 and are apart from the second external electrode 15. The second internal electrodes 13 are drawn to the end surface 11b to be connected to the second external electrode 15 and are apart from the first external electrode 14.

Further, the first and second internal electrodes 12 and 13 are not drawn to the side surfaces 11c and 11d. Accordingly, side margins made of dielectric ceramics are formed on the sides of the side surfaces 11c and 11d of the multi-layer unit 16.

Typically, the first and second internal electrodes 12 and 13 mainly contain nickel (Ni) and function as internal electrodes of the multi-layer ceramic capacitor 10. It should be noted that the first and second internal electrodes 12 and 13 may contain at least one of copper (Cu), silver (Ag), or palladium (Pd) as a main component, other than nickel.

Each of the ceramic layers 18 is disposed between the first internal electrode 12 and the second internal electrode 13 and is made of dielectric ceramics. In order to increase the capacitance of the multi-layer unit 16, the ceramic layer 18 is made of dielectric ceramics having a high dielectric constant.

For the dielectric ceramics having a high dielectric constant, polycrystal of a barium titanate ($BaTiO_3$) based material, i.e., polycrystal having a Perovskite structure containing barium (Ba) and titanium (Ti) is used. This provides the multi-layer ceramic capacitor 10 with a large capacitance.

It should be noted that the ceramic layer 18 may be made of a strontium titanate ($SrTiO_3$) based material, a calcium titanate ($CaTiO_3$) based material, a magnesium titanate ($MgTiO_3$) based material, a calcium zirconate ($CaZrO_3$) based material, a calcium zirconate titanate ($Ca(Zr,Ti)O_3$) based material, a barium zirconate ($BaZrO_3$) based material, a titanium oxide ($TiO_2$) based material, or the like.

The covers 17 are also made of dielectric ceramics. The material of the covers 17 only needs to be insulating ceramics, but use of the dielectric ceramics similar to the dielectric ceramics of the ceramic layers 18 leads to suppression of internal stress in the ceramic body 11.

With such a condiguration, when a voltage is applied between the first external electrode 14 and the second external electrode 15 in the multi-layer ceramic capacitor 10, the voltage is applied to the plurality of ceramic layers 18 between the first internal electrodes 12 and the second internal electrodes 13. Thus, the multi-layer ceramic capacitor 10 stores charge corresponding to the voltage applied between the first external electrode 14 and the second external electrode 15.

It should be noted that the basic configuration of the multi-layer ceramic capacitor 10 according to this embodiment is not limited to the configuration shown in FIGS. 1 to 3 and can be changed as appropriate.

2. Detailed Configuration of Ceramic Body

As shown in FIG. 3, the ceramic body 11 is characterized in that a height dimension T in the Z-axis direction is 1.1 times or more and 1.6 times or less a width dimension W in the Y-axis direction. This can increase the number of laminated first and second internal electrodes 12 and 13 and increase the capacitance of the multi-layer ceramic capacitor 10 without increasing a cross-sectional area of the ceramic body 11 in the X-Y plane.

Here, the height dimension T of the ceramic body 11 means a dimension along the Z-axis direction at the center portion of the ceramic body 11 in the Y-axis direction, on a Y-Z cross section (see FIG. 3) that is cut at the center portion of the multi-layer ceramic capacitor 10 in the X-axis direction. In this embodiment, the height dimension T can be defined by a relationship between the width dimension W and a length dimension L to be described later.

The width dimension W of the ceramic body 11 means a dimension along the Y-axis direction at the center portion of the ceramic body 11 in the Z-axis direction, on the Y-Z cross section (see FIG. 3) that is cut at the center portion of the multi-layer ceramic capacitor 10 in the X-axis direction. The width dimension W is not particularly limited and can be set to, for example, 0.10 mm or more and 1.50 mm or less.

The length dimension L of the ceramic body 11 may be larger than 1.0 times and equal to or smaller than 1.5 times the height dimension T. This can increase the height dimension T and increase the capacitance without increasing the mounting area for the multi-layer ceramic capacitor 10 and allows handling at the time of manufacturing or mounting to be described later to be smoothly performed.

The length dimension L of the ceramic body 11 means a dimension along the X-axis direction at the center portion of the ceramic body 11 in the Z-axis direction, on the X-Z cross section (see FIG. 2) that is cut at the center portion of the multi-layer ceramic capacitor 10 in the Y-axis direction. The length dimension L is not particularly limited and can be set to, for example, 0.20 mm or more and 2.00 mm or less.

In order to further increase the number of layers of the first and second internal electrodes 12 and 13 and increase the capacitance of the multi-layer ceramic capacitor 10, the thickness of the cover 17 may be reduced. As an example, the dimension (thickness) of the cover 17 in the Z-axis direction may be 15 μm or less.

In order to further increase the capacitance of the multi-layer ceramic capacitor 10, the thickness of each ceramic layer 18 between the first and second internal electrodes 12 and 13 may be reduced. For example, a mean dimension (mean thickness) of the ceramic layers 18 in the Z-axis direction may be set to, for example, 1.0 μm or less or further 0.5 μm or less.

It should be noted that the mean thickness of the ceramic layers 18 can be calculated as a mean value of the thicknesses measured at a plurality of sites of the ceramic layers 18. A position at which the thickness of the ceramic layer 18 is to be measured or the number of positions may be optionally determined. Hereinafter, an example of a method of measuring a mean thickness T of the ceramic layers 18 will be described with reference to FIG. 4.

Figure 4:
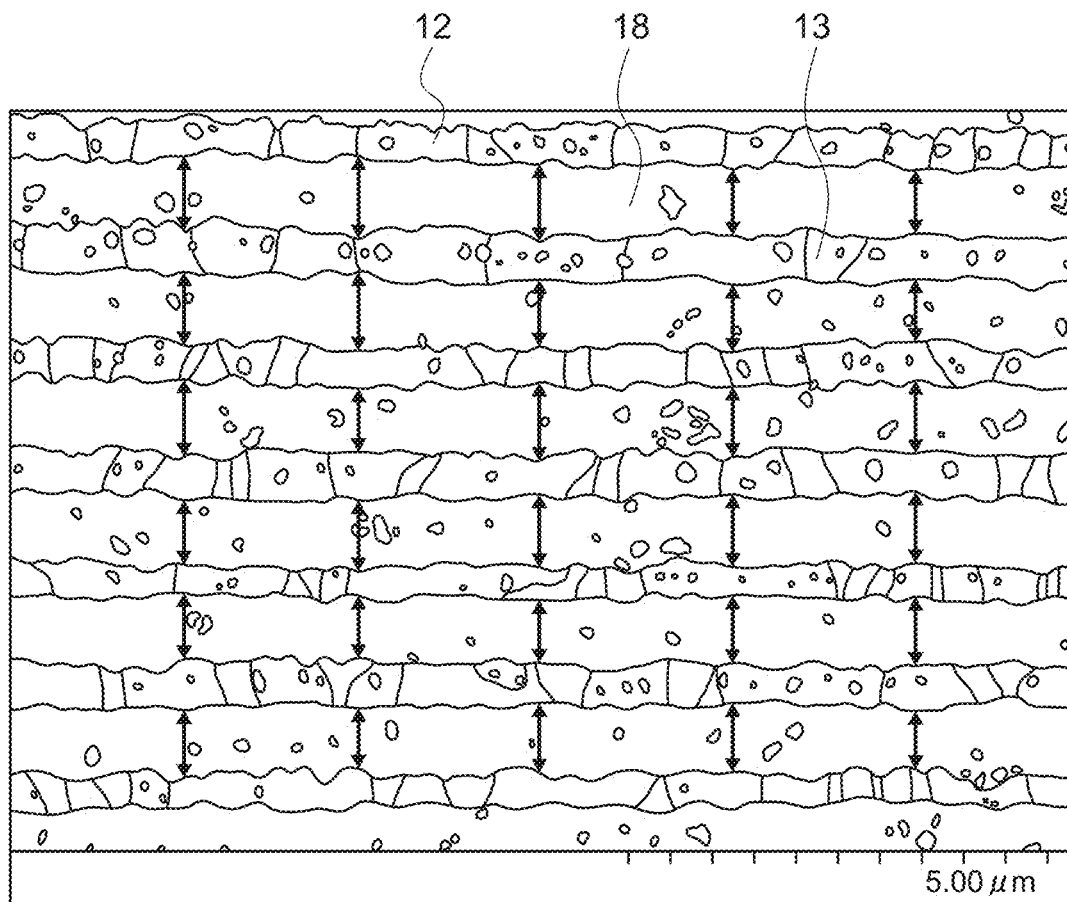
FIG. 4 is a diagram showing a microstructure of a cross section of the multi-layer ceramic capacitor.

FIG. 4 is a diagram showing a microstructure of a cross section of the ceramic body 11, which is observed in the visual field of 12.6 μm×8.35 μm with a scanning electron microscope. For each of the six ceramic layers 18 within the visual field, the thickness is measured at five sites indicated by the arrows arranged at equal intervals of 2 μm. A mean value of the thicknesses obtained at the 30 sites can be set as a mean thickness.

In such a manner, in the multi-layer ceramic capacitor 10 of this embodiment, the height dimension T can be increased and a large number of first and second internal electrodes 12 and 13 can be laminated without increasing the mounting area, and thus a large capacitance can be achieved.

Meanwhile, in the past, the multi-layer ceramic capacitor 10 has been difficult to handle at the time of mounting, and it has been difficult to achieve a multi-layer ceramic capacitor in which the height dimension T is larger than the width dimension W.

In this regard, in the multi-layer ceramic capacitor 10 of this embodiment, one main surface (first main surface) 11e includes a first flat region F1 facing in the Z-axis direction, and the other main surface (second main surface) 11f includes a second flat region F2, which is on the side opposite to the first flat region F1 and faces in the Z-axis direction. With this configuration, as will be described later, handleability at the time of mounting can be improved even if the height dimension T is larger than the width dimension W.

The first flat region F1 is a flat region that is formed at the center portion of the main surface 11e in the X-axis direction. The second flat region F2 is a flat region that is formed at the center portion of the main surface 11f in the Y-axis direction. Peripheral portions of each of the main surfaces 11e and 11f are positioned outward in the X-axis direction and the Y-axis direction of those center portions and have curved surfaces extending from the first flat region F1 and the second flat region F2.

Figure 5:
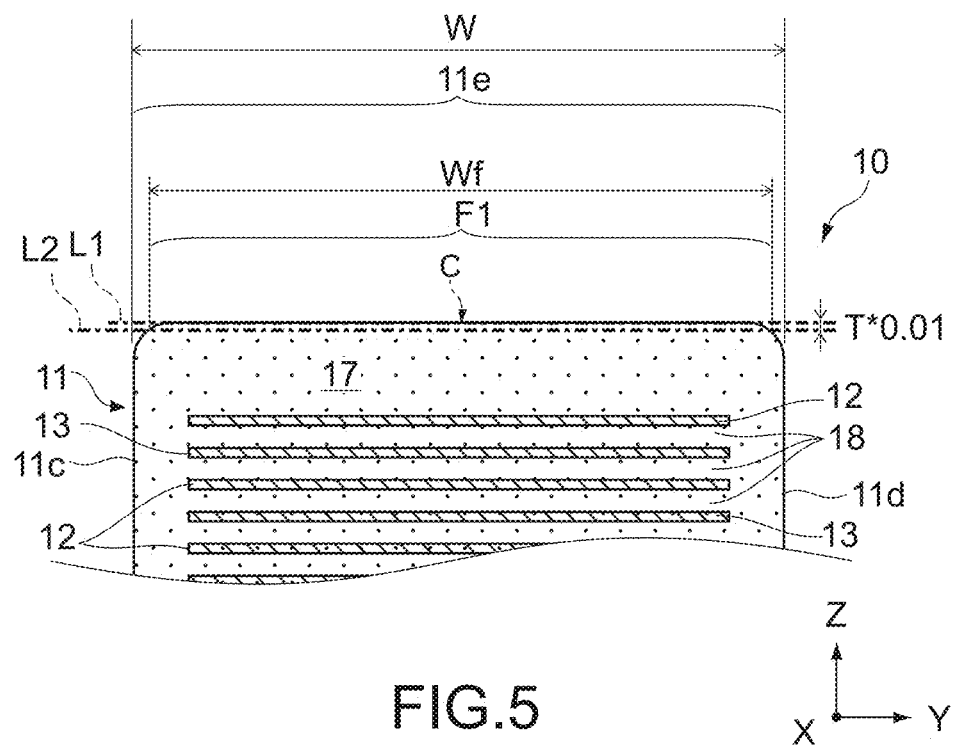
FIG. 5 is a partially enlarged view of FIG. 3.

FIG. 5 is a partially enlarged view of FIG. 3. The first flat region F1 will be described in detail with reference to FIG. 5.

It is assumed that a first imaginary line L1 and a second imaginary line L2 are defined on the Y-Z cross section of the ceramic body 11, the first imaginary line L1 passes through the center point C of the main surface 11e in the Y-axis direction and orthogonally intersects with the Z-axis direction (the first imaginary line L1 is parallel to the Y-axis direction), and the second imaginary line L2 is parallel to the first imaginary line L1 and has an interval from the first imaginary line L1, the interval being 1% of the height dimension T of the ceramic body 11 (T*0.01). In this case, the first flat region F1 means a region between two points at which the second imaginary line L2 and the main surface 11e intersect with each other. "The center point C of the main surface 11e in the Y-axis direction" described herein means the center of the width dimension of the main surfaces 11e along the Y-axis direction. FIG. 5 shows the center point C of the main surface 11e in the Y-axis direction by an arrow and shows the first imaginary line L1 and the second imaginary line L2 by thick chain lines.

When the first flat region F1 is defined as described above, a width dimension Wf of the first flat region F1 along the Y-axis direction corresponds to a distance along the Y-axis direction between the two points at which the second imaginary line L2 and the main surface 11e intersect with each other. The width dimension Wf of the first flat region F1 can be set to be 80% or more and less than 100% of the width dimension W of the ceramic body 11. This allows the width dimension Wf of the first flat region F1 to be sufficiently ensured and allows handleability at the time of mounting to be further improved.

Figure 6:
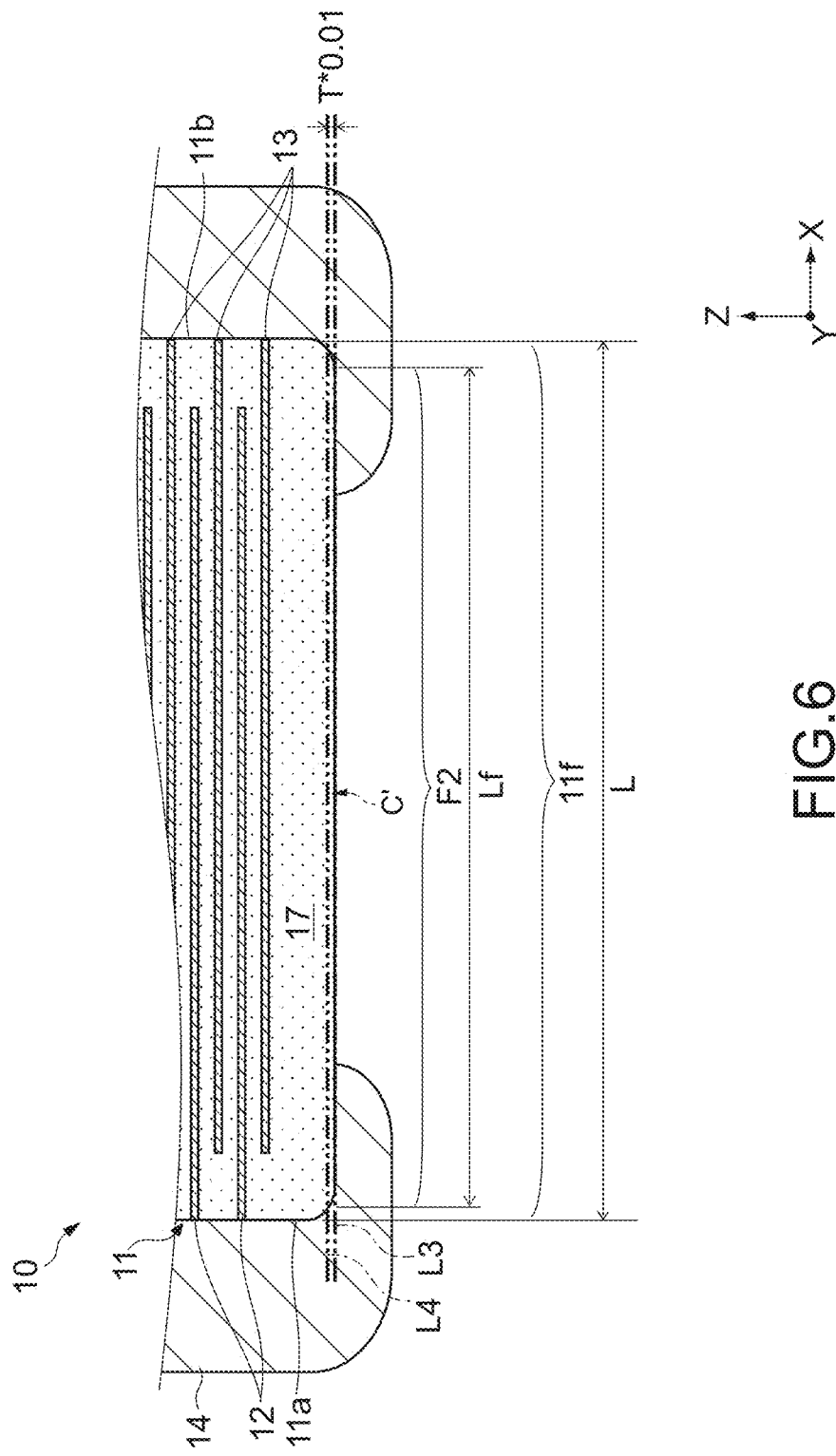
FIG. 6 is a partially enlarged view of FIG. 2.

FIG. 6 is a partially enlarged view of FIG. 2. The second flat region F2 will be described in detail with reference to FIG. 6.

It is assumed that a third imaginary line L3 and a fourth imaginary line L4 are defined on the X-Z cross section at the center portion of the ceramic body 11 in the Y-axis direction, the third imaginary line L3 passes through the center point C' of the main surface 11f in the X-axis direction and orthogonally intersects with the Z-axis direction (the third imaginary line L3 is parallel to the X-axis direction), and the fourth imaginary line L4 is parallel to the third imaginary line L3 and has an interval from the third imaginary line L3, the interval being 1% of the height dimension T of the ceramic body 11 (T*0.01). In this case, the second flat region F2 means a region between two points at which the fourth imaginary line L4 and the main surface 11f intersect with each other. "The center point C' of the main surface 11f in the X-axis direction" described herein means the center of the length dimension of the main surface 11f along the X-axis direction. FIG. 6 shows the center point C' of the main surface 11f in the X-axis direction by an arrow and shows the third imaginary line L3 and the fourth imaginary line L4 by thick chain double-dashed lines.

When the second flat region F2 is defined as described above, a length dimension Lf of the second flat region F2 along the X-axis direction corresponds to a distance along the X-axis direction between the two points at which fourth imaginary line L4 and the main surface 11f intersect with each other. The length dimension Lf of the second flat region F2 can be set to be 80% or more and less than 100% of the length dimension L of the ceramic body 11. This allows the second flat region F2 to be extended to the peripheral portions of the ceramic body 11 in the X-axis direction, and allows the first external electrode 14 and the second external electrode 15 to be formed on the second flat region F2. Therefore, the posture of the multi-layer ceramic capacitor 10 at the time of mounting can be stabilized and handleability can be further improved.

The multi-layer ceramic capacitor 10 including the first flat region F1 and the second flat region F2 can be produced by the following production method.

3. Method of Producing Multi-Layer Ceramic Capacitor 10

Figure 7:
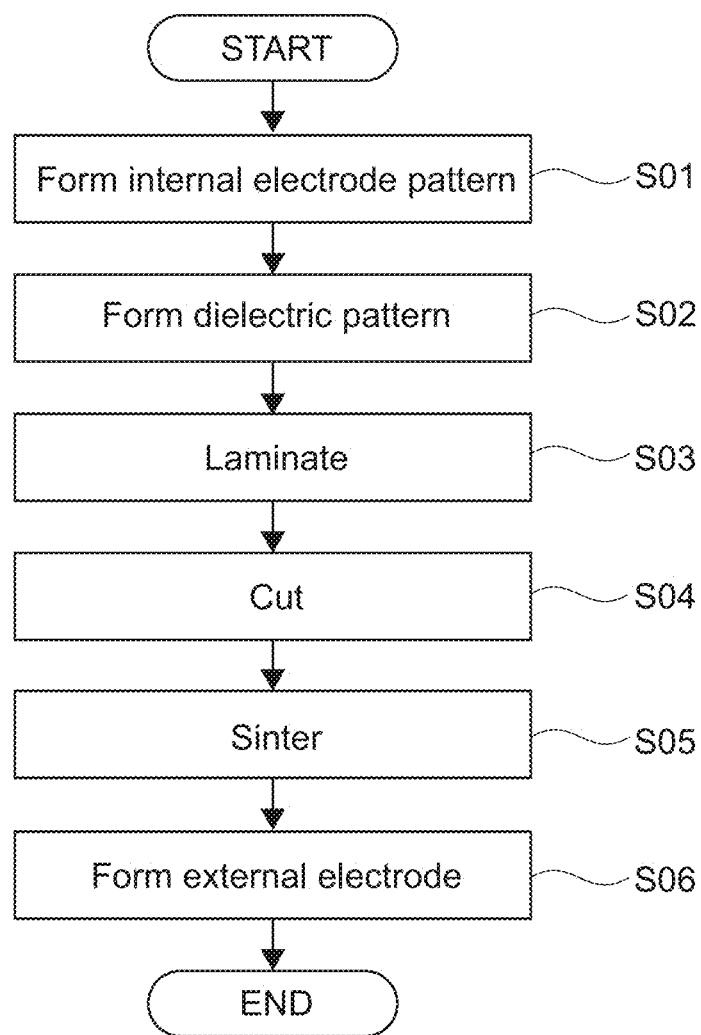
FIG. 7 is a flowchart showing a method of producing the multi-layer ceramic capacitor.

FIG. 7 is a flowchart showing a method of producing the multi-layer ceramic capacitor 10. FIGS. 8A to 12 are views each showing a production process of the multi-layer ceramic capacitor 10. Hereinafter, the method of producing the multi-layer ceramic capacitor 10 will be described along FIG. 7 with reference to FIGS. 8A to 12 as appropriate.

3.1 Step S01: Formation of Internal Electrode Pattern

In Step S01, first internal electrode patterns 112 and second internal electrode patterns 113 are respectively formed on first ceramic sheets 101 and second ceramic sheets 102 for forming the multi-layer unit 16.

The first and second ceramic sheets 101 and 102 are configured as unsintered dielectric green sheets mainly containing dielectric ceramics. For the dielectric ceramics, powder having a particle diameter of, for example, 20 nm to 200 nm can be used. The first and second ceramic sheets 101 and 102 are each formed into a sheet shape by using a roll coater or a doctor blade, for example. The thickness of each of the first and second ceramic sheets 101 and 102 is not limited, but it is adjusted to have 1.5 μm or less, for example.

FIGS. 8A and 8B are plan views of the first ceramic sheet 101 and the second ceramic sheet 102, respectively. At this stage, the first and second ceramic sheets 101 and 102 are each formed into a large-sized sheet that is not singulated. FIGS. 8A and 8B each show cutting lines Lx and Ly to be used when the sheets are singulated into the multi-layer ceramic capacitors 10. The cutting lines Lx are parallel to the X axis, and the cutting lines Ly are parallel to the Y axis.

As shown in FIGS. 8A and 8B, the unsintered first internal electrode patterns 112 corresponding to the first internal electrodes 12 are formed on the first ceramic sheet 101, and the unsintered second internal electrode patterns 113 corresponding to the second internal electrodes 13 are formed on the second ceramic sheet 102.

The first internal electrode patterns 112 and the second internal electrode patterns 113 can be formed by applying an optional electrically conductive paste to the first ceramic sheets 101 and the second ceramic sheets 102, respectively. A method of applying the electrically conductive paste can be optionally selected from well-known techniques. For example, for the application of the electrically conductive paste, a screen printing method or a gravure printing method can be used.

Each of the first internal electrode patterns 112 on the first ceramic sheets 101 is formed in a substantially rectangular shape that crosses one cutting line Ly1 or Ly2 and extends in the X-axis direction. The first internal electrode patterns 112 are cut on the cutting lines Ly1, Ly2, and Lx, thus forming the first internal electrodes 12 of the multi-layer ceramic capacitors 10. The first internal electrode pattern 112 on the cutting line Ly1 or Ly2 corresponds to a drawn portion to be exposed on the end surface 11a.

In the first ceramic sheet 101, a first column including the first internal electrode patterns 112 that extend across the cutting lines Ly1 and are disposed along the X-axis direction, and a second column including the first internal electrode patterns 112 that extend across the cutting lines Ly2 and are disposed along the X-axis direction are arranged alternately in the Y-axis direction. In the first column, the first internal electrode patterns 112 adjacent to each other in the X-axis direction face each other while sandwiching the cutting line Ly2 therebetween. In the second column, the first internal electrode patterns 112 adjacent to each other in the X-axis direction face each other while sandwiching the cutting line Ly1 therebetween. In other words, the first internal electrode patterns 112 are displaced by one chip in the X-axis direction between the first column and the second column adjacent to each other in the Y-axis direction.

The second internal electrode patterns 113 on the second ceramic sheets 102 are configured to be similar to the first internal electrode patterns 112. However, in the second ceramic sheet 102, the second internal electrode patterns 113 in a column corresponding to the first column of the first ceramic sheet 101 extend across the cutting lines Ly2, and the second internal electrode patterns 113 in a column corresponding to the second column of the first ceramic sheet 101 extend across the cutting lines Ly1. In other words, the second internal electrode patterns 113 are displaced from the first internal electrode patterns 112 by one chip in the X-axis direction or the Y-axis direction.

An electrode non-formation region N is a region in which the first and second internal electrode patterns 112 and 113 are not formed on the first and second ceramic sheets 101 and 102. In the first ceramic sheet 101, the electrode non-formation region N includes a plurality of belt-like regions extending along the cutting lines Ly1 and Ly2 between the first internal electrode patterns 112 adjacent to each other in the X-axis direction, and a plurality of belt-like regions extending along the cutting lines Lx between the first internal electrode patterns 112 adjacent to each other in the Y-axis direction. The electrode non-formation region N is formed in a lattice pattern as a whole, in which those belt-like regions are alternately crossed. The electrode non-formation region N corresponds to side margins and end margins of the multi-layer ceramic capacitor 10.

The electrode non-formation region N in the second ceramic sheet 102 is also formed in a similar manner.

FIG. 9 is a partially enlarged cross-sectional view taken along the C-C' line of FIG. 8A.

In FIG. 9, the internal electrode patterns 112 (113) each having a predetermined thickness d1 are formed on the ceramic sheet 101 (102). The thickness d1 of the internal electrode patterns 112 (113) is a mean thickness of the internal electrode patterns 112 and can be calculated as, for example, a mean value of the thicknesses measured at a plurality of sites as in the case of the mean thickness of the ceramic layers 18.

Figure 10:
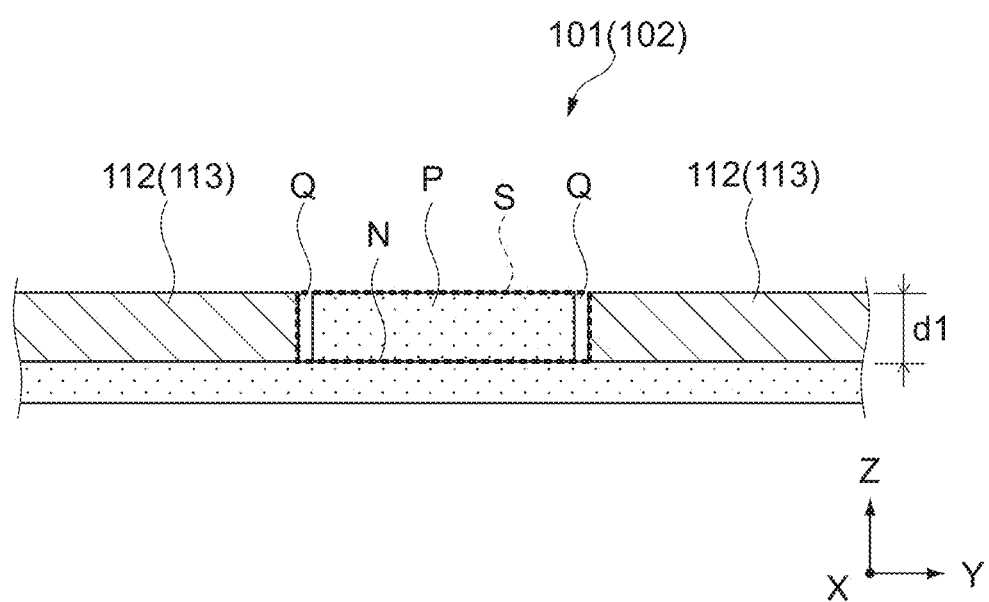
FIG. 10 is a partial cross-sectional view similar to FIG. 9 and a view for describing Step S02 of FIG. 7.

A space portion S sandwiched between the adjacent internal electrode patterns 112 (113) is formed in the electrode non-formation region N. The space portion S is a space region having a thickness d1 and facing the electrode non-formation region N. In other words, the space portion S has a volume obtained by multiplying the area of the electrode non-formation region N by the thickness d1. FIGS. 9 and 10 each show the space portion S surrounded by a thick broken line.

3.2 Step S02: Formation of Dielectric Pattern

In Step S02, a dielectric pattern P is formed in the electrode non-formation region N around the first internal electrode patterns 112 on the first ceramic sheet 101 and around the second internal electrode patterns 113 on the second ceramic sheet 102.

FIG. 10 is a cross-sectional view of the same position as that of FIG. 9 and shows a state in which the dielectric pattern P is formed in the space portion S.

The dielectric pattern P can be formed by applying a ceramic paste to the electrode non-formation region N of the ceramic sheet 101 (102). The ceramic paste only needs to mainly contain dielectric ceramics, but use of dielectric ceramics similar to that of the first and second ceramic sheets 101 and 102 leads to suppression of internal stress at the time of sintering. For the application of the ceramic paste, a screen printing method or a gravure printing method can be used, for example.

In this embodiment, the dielectric pattern P is formed to occupy 75% or more and less than 100% of the space portion S. In other words, the volume of the dielectric pattern P is 75% or more and less than 100% of the volume of the space portion S, the volume of the space portion S being obtained by multiplying the area of the electrode non-formation region N by the thickness d1 of the internal electrode pattern 112 (113).

A mean thickness of the dielectric pattern P only needs to be equal to or smaller than the thickness d1 of the space portion S. For example, the mean thickness of the dielectric pattern P may be 80% or more and 100% or less when the thickness d1 is assumed as 100%. The mean thickness of the dielectric pattern P can be a mean value measured in a similar manner to the case where the thicknesses of the first and second internal electrode patterns 112 and 113 are measured.

The ceramic sheet 101 (102) may have gaps Q, in which the dielectric pattern P is not formed, around the internal electrode patterns 112 (113). When the gaps Q between the internal electrode patterns 112 (113) and the dielectric pattern P are provided, the dielectric pattern P can be inhibited from being formed on the internal electrode patterns 112 (113).

3.3 Step S03: Lamination

Figure 11:
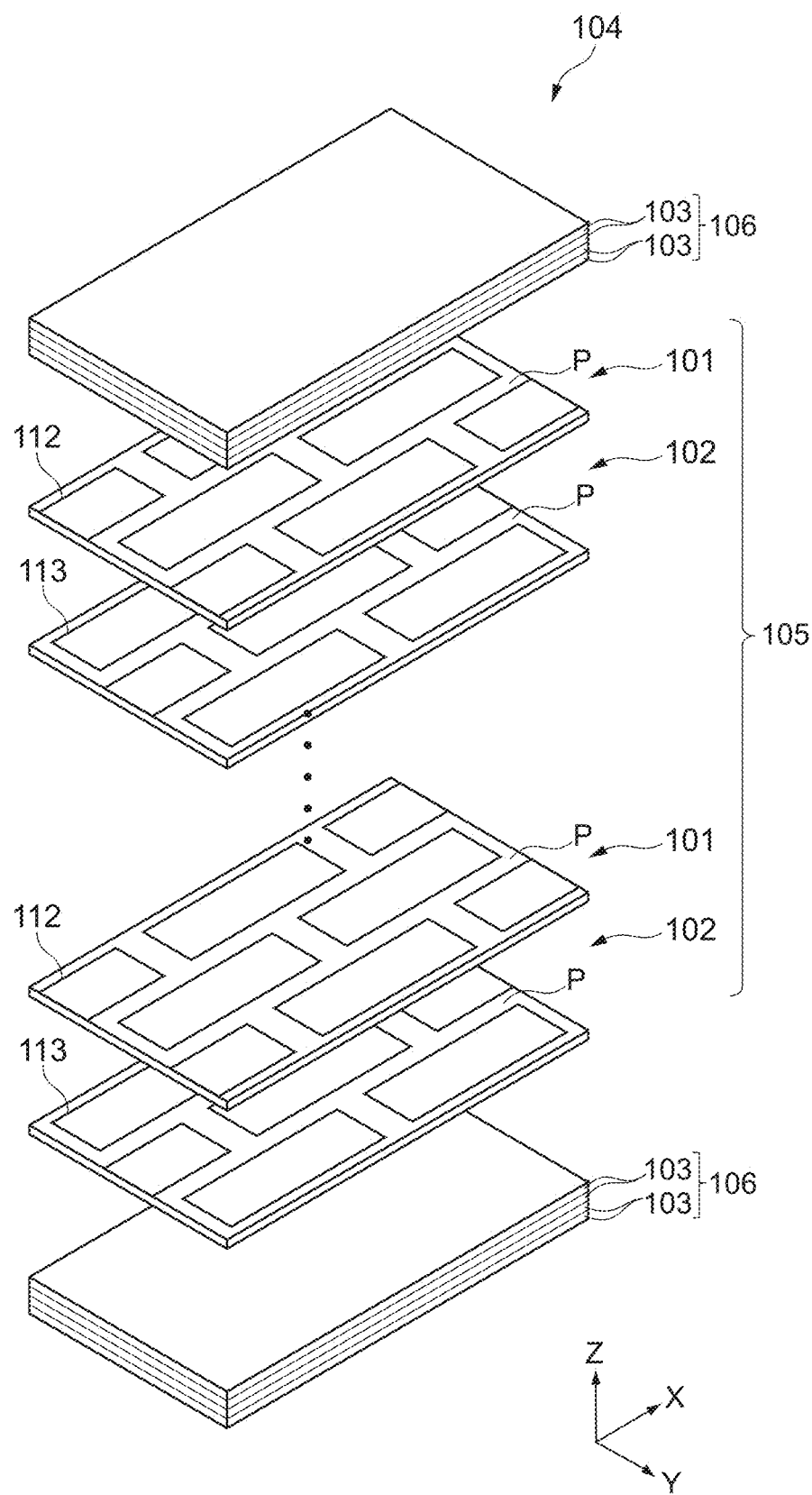
FIG. 11 is a perspective view showing a production process of the multi-layer ceramic capacitor.

In Step S03, the first and second ceramic sheets 101 and 102 prepared in Steps S01 and S02 and third ceramic sheets 103 are laminated as shown in FIG. 11, to produce a multi-layer sheet 104. The third ceramic sheet 103 is a ceramic sheet on which the first and second internal electrode patterns 112 and 113 and the dielectric pattern P are not formed. It should be noted that FIG. 11 omits the illustration of the gaps Q.

The multi-layer sheet 104 includes a laminated electrode sheet 105 and two laminated cover sheets 106. The first ceramic sheets 101 and the second ceramic sheets 102 are alternately laminated in the Z-axis direction in the laminated electrode sheet 105. Only the third ceramic sheets 103 are laminated in the laminated cover sheet 106. The two laminated cover sheets 106 are provided on the upper surface and the lower surface of the laminated electrode sheet 105 in the Z-axis direction. The laminated electrode sheet 105 corresponds to the multi-layer unit 16 after sintering. The laminated cover sheets 106 correspond to the covers 17 after sintering.

The number of first and second ceramic sheets 101 and 102 to be laminated in the laminated electrode sheet 105 is adjusted so as to obtain a desired capacitance and a desired height dimension T after sintering.

The number of third ceramic sheets 103 to be laminated in the laminated cover sheet 106 is not limited to the example shown in FIG. 11 and is adjusted as appropriate.

The multi-layer sheet 104 is integrated by pressure-bonding the first, second, and third ceramic sheets 101, 102, and 103. For the pressure-bonding of the first, second, and third ceramic sheets 101, 102, and 103, for example, hydrostatic pressing or uniaxial pressing is favorably used. This makes it possible to obtain a high-density multi-layer sheet 104.

3.4 Step S04: Cutting

In Step S04, the multi-layer sheet 104 obtained in Step S03 is cut along the cutting lines Lx and Ly, to produce an unsintered ceramic body 111.

Figure 12:
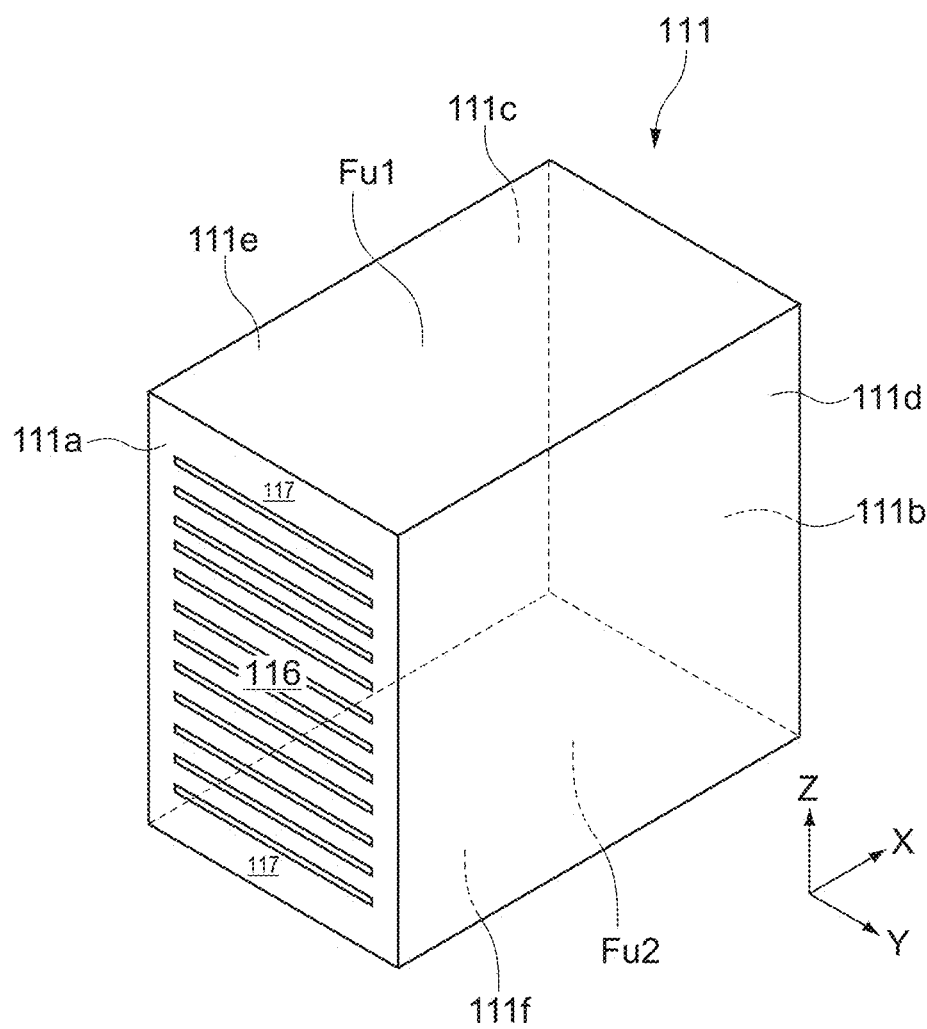
FIG. 12 is a perspective view showing a production process of the multi-layer ceramic capacitor.

FIG. 12 is a perspective view of the ceramic body 111 obtained in Step S04.

As shown in FIG. 12, the unsintered ceramic body 111 has two end surfaces 111a and 111b facing in the X-axis direction, two side surfaces 111c and 111d facing in the Y-axis direction, and two main surfaces 111e and 111f facing in the Z-axis direction. A cut portion corresponding to the laminated electrode sheet 105 is formed as an unsintered multi-layer unit 116. Cut portions corresponding to the laminated cover sheets 106 are formed as unsintered covers 117.

The unsintered ceramic body 111 has such an outer shape that the height dimension T in the Z-axis direction is 1.1 times or more and 1.6 times or less the width dimension in the Y-axis direction after sintering. Further, the main surface 111e includes an unsintered first flat region Fu1, and the main surface 111f includes an unsintered second flat region Fu2. The unsintered first flat region Fu1 and the unsintered second flat region Fu2 are defined in a manner similar to the first flat region F1 and the second flat region F2. A width dimension of the first flat region Fu1 in the Y-axis direction can be set to 80% or more and less than 100% of the width dimension of the unsintered ceramic body 111, as in the case of the first flat region F1. Similarly, a length dimension of the unsintered second flat region Fu2 in the X-axis direction can be set to 80% or more and less than 100% of the length dimension of the unsintered ceramic body 111, as in the case of the second flat region F2. It should be noted that the unsintered ceramic body 111 may be chamfered by barrel polishing or the like after the cutting. In such a case, barrel polishing is performed such that the width dimension of the first flat region Fu1 and the length dimension of the second flat region Fu2 fall within the ranges described above.

3.5 Step S05: Sintering

In Step S05, the unsintered ceramic body 111 obtained in Step S04 is sintered, to produce the ceramic body 11 shown in FIGS. 1 to 3. In other words, in Step S05, the multi-layer unit 116 becomes the multi-layer unit 16, and the covers 117 become the covers 17. Sintering can be performed in a reduction atmosphere or a low-oxygen partial pressure atmosphere, for example.

3.6 Step S06: Formation of External Electrode

In Step S06, the first external electrode 14 and the second external electrode 15 are formed on the ceramic body 11 obtained in Step S05, to produce the multi-layer ceramic capacitor 10 shown in FIGS. 1 to 3.

In Step S06, first, an unsintered electrode material is applied so as to cover one of the end surfaces of the ceramic body 11 that face in the X-axis direction, and then applied so as to cover the other end surface of the ceramic body 11 that faces in the X-axis direction. The unsintered electrode material applied to the ceramic body 11 is baked in a reduction atmosphere or a low-oxygen partial pressure atmosphere, for example, to form base films on the ceramic body 11. On the base films baked onto the ceramic body 11, intermediate films and surface films are formed by plating such as electrolytic plating, thus completing the first external electrode 14 and the second external electrode 15.

It should be noted that part of the processing in Step S06 described above may be performed before Step S05. For example, before Step S05, the unsintered electrode material may be applied to both the end surfaces of the unsintered ceramic body 111 that face in the X-axis direction, and in Step S05, the unsintered ceramic body 111 may be sintered and, simultaneously, the unsintered electrode material may be baked to form the base films of the first external electrode 14 and the second external electrode 15. Alternatively, the unsintered electrode material may be applied to the ceramic body 111 that has been subjected to debinder processing, to simultaneously sinter the unsintered electrode material and the ceramic body 111.

As shown in FIGS. 1 to 3, the ceramic body 11 thus produced has the height dimension T in the Z-axis direction, which is 1.1 times or more and 1.6 times or less the width dimension W in the Y-axis direction, and includes the first flat region F1 and the second flat region F2. In Step S02, the first flat region F1 and the second flat region F2 are each formed by forming the dielectric pattern P that occupies 75% or more and less than 100% of the space portion S.

If the dielectric pattern is not formed, a capacitance forming portion in which the internal electrode patterns are laminated, and a side margin portion and an end margin portion in each of which the electrode non-formation regions are laminated, have a difference in height dimension in the Z-axis direction due to the thicknesses of the internal electrode patterns. Additionally, as the number of laminated ceramic sheets becomes larger, that is, as the height dimension of the multi-layer ceramic capacitor becomes larger, the difference in height dimension in the Z-axis direction between the above-mentioned portions becomes larger. For that reason, in the ceramic body obtained by pressure-bonding and cutting the laminated ceramic sheets, the height dimension gradually increases from the peripheral portions in the X- and Y-axis directions toward the center portions in the X- and Y-axis directions, and the main surfaces are formed as curved surfaces protruding in the Z-axis direction.

Further, if the dielectric pattern is intended to be formed on the entire electrode non-formation region N (i.e., in a state of occupying 100% of the space portion), even with a slight displacement of the dielectric pattern, the dielectric pattern overlaps with the internal electrode patterns. Accordingly, the thickness of the overlapping portion is increased, and the height of the ceramic body in the Z-axis direction becomes uneven.

Meanwhile, when the proportion of the dielectric pattern occupying the space portion is less than 75%, a gap between the internal electrode pattern and the dielectric pattern becomes larger. As a result, the laminated ceramic sheets sink down into the gaps at the time of pressure-bonding, and the height of the ceramic body in the Z-axis direction becomes uneven again.

In this embodiment, the dielectric pattern P is formed so as to occupy 75% or more of the space portion S, and thus the gaps Q can be made small to such an extent that the ceramic sheets laminated in Step S03 do not sink down into the gaps Q. Accordingly, the height of the electrode sheet 105 in the Z-axis direction can be formed to be uniform, and the first flat region Fu1 and the second flat region Fu2 are formed in the unsintered ceramic body 111. Therefore, the first flat region F1 and the second flat region F2 are also formed in the sintered ceramic body 11.

Further, the dielectric pattern P is formed so as to occupy a portion less than 100% of the space portion S, and thus narrow gaps Q can be provided in the electrode non-formation region N. Accordingly, even when the dielectric pattern P is slightly displaced with respect to the internal electrode patterns 112 and 113, the displacement is mitigated by the gaps Q. Therefore, it is possible to reduce the risk of overlapping of the dielectric pattern P with the internal electrode patterns 112 and 113.

Additionally, after the production, the multi-layer ceramic capacitor 10 is packaged as a package 100 with the first flat region F1 being faced upward in the Z-axis direction and with the second flat region F2 being faced downward in the Z-axis direction. Accordingly, a mounting step of taking the multi-layer ceramic capacitor 10 out of the package 100 and mounting the multi-layer ceramic capacitor 10 to an electronic device can be smoothly performed.

Hereinafter, the configuration of the package 100 and a method of mounting the multi-layer ceramic capacitor 10 will be described in detail.

4. Configuration of Package 100 for Multi-Layer Ceramic Capacitor 10

Figure 13:
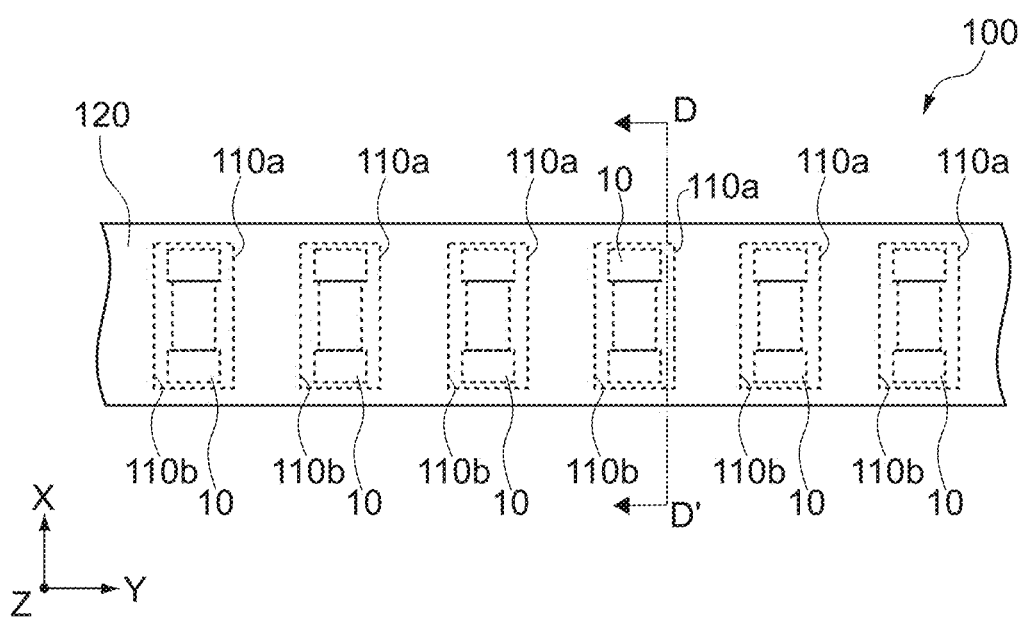
FIG. 13 is a plan view of a multi-layer ceramic capacitor package according to an embodiment of the present disclosure.
Figure 14:
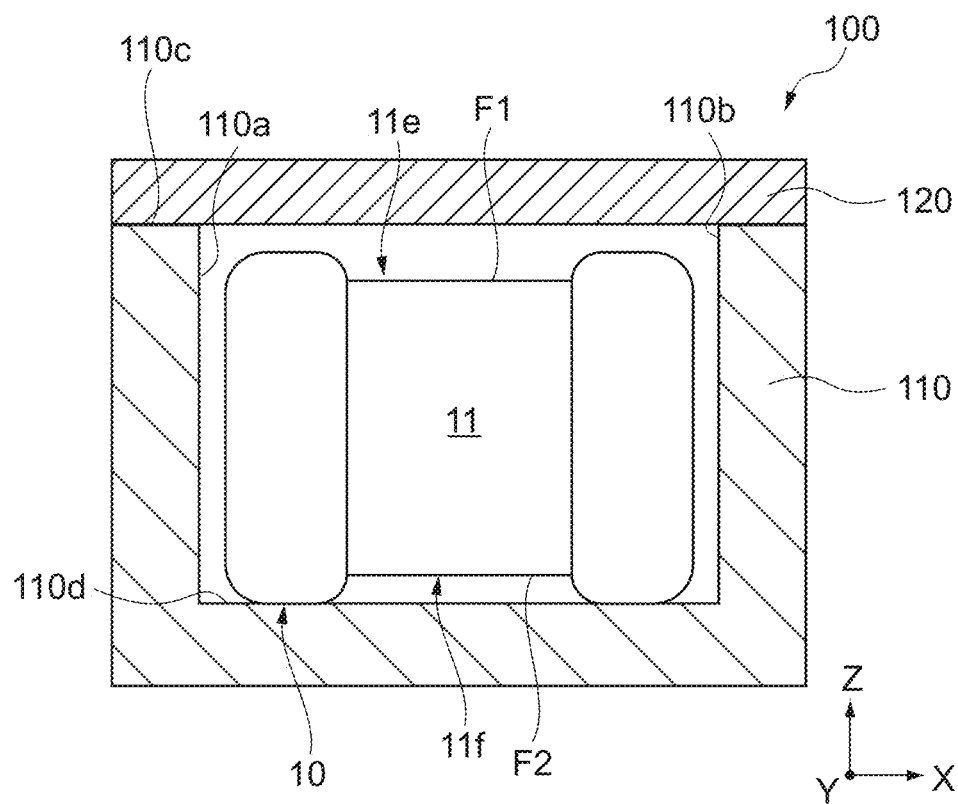
FIG. 14 is a cross-sectional view of the package taken along the D-D' line in FIG. 13.

FIG. 13 is a plan view of the package 100 for the multi-layer ceramic capacitor 10. FIG. 14 is a cross-sectional view taken along the D-D' line in FIG. 13. It should be noted that the configuration of the package 100 according to this embodiment is not limited to the configuration shown in FIGS. 13 and 14.

For example, the package 100 is long in the Y-axis direction, has a predetermined depth in the Z-axis direction, and houses a plurality of multi-layer ceramic capacitors 10.

The package 100 includes a housing portion 110, a sealing portion 120, and a plurality of multi-layer ceramic capacitors 10.

The housing portion 110 includes a plurality of recesses 110a formed at predetermined intervals along the Y-axis direction.

The housing portion 110 is typically a carrier tape, but it may be a chip tray in which the recesses 110a that house the multi-layer ceramic capacitors 10 are arranged in a lattice pattern, for example. Further, a material forming the housing portion 110 is also not particularly limited, and a synthetic resin, paper, or the like can be used therefor.

The recess 110a is formed downward from an upper surface 110c of the housing portion 110 in the Z-axis direction and has a size capable of housing each multi-layer ceramic capacitor 10. A take-out opening 110b is formed on the upper surface 110c side of the recess 110a. The take-out opening 110b is used when the multi-layer ceramic capacitor 10 is housed in the recess 110a and taken out of the recess 110a.

The sealing portion 120 is disposed on the housing portion 110 so as to be capable of being peeled off. The sealing portion 120 is formed to cover the take-out openings 110b of the recesses 110a in the Z-axis direction. The sealing portion 120 is typically a cover tape, but it is not particularly limited as long as the sealing portion 120 is a member capable of being peeled off from the housing portion 110 and having a function of sealing the recesses 110a. Further, the sealing portion 120 may be made of the same type of material as that of the housing portion 110 or may be made of a different material.

The multi-layer ceramic capacitor 10 is housed in the recess 110a with the first flat region F1 being faced to the take-out opening 110b side (upward in the Z-axis direction) and with the second flat region F2 being faced to the bottom surface 110d side of the recess 110a (downward in the Z-axis direction). It is favorable that the first flat region F1 on the take-out opening 110b side is formed such that the width dimension Wf is 80% or more and less than 100% of the width dimension W of the ceramic body 11. It is favorable that the second flat region F2 on the bottom surface 110d side of the recess 110a is formed such that the length dimension Lf in the X-axis direction is 80% or more and less than 100% of the length dimension L of the ceramic body 11.

5. Method of Mounting Multi-Layer Ceramic Capacitor 10

Figure 15:
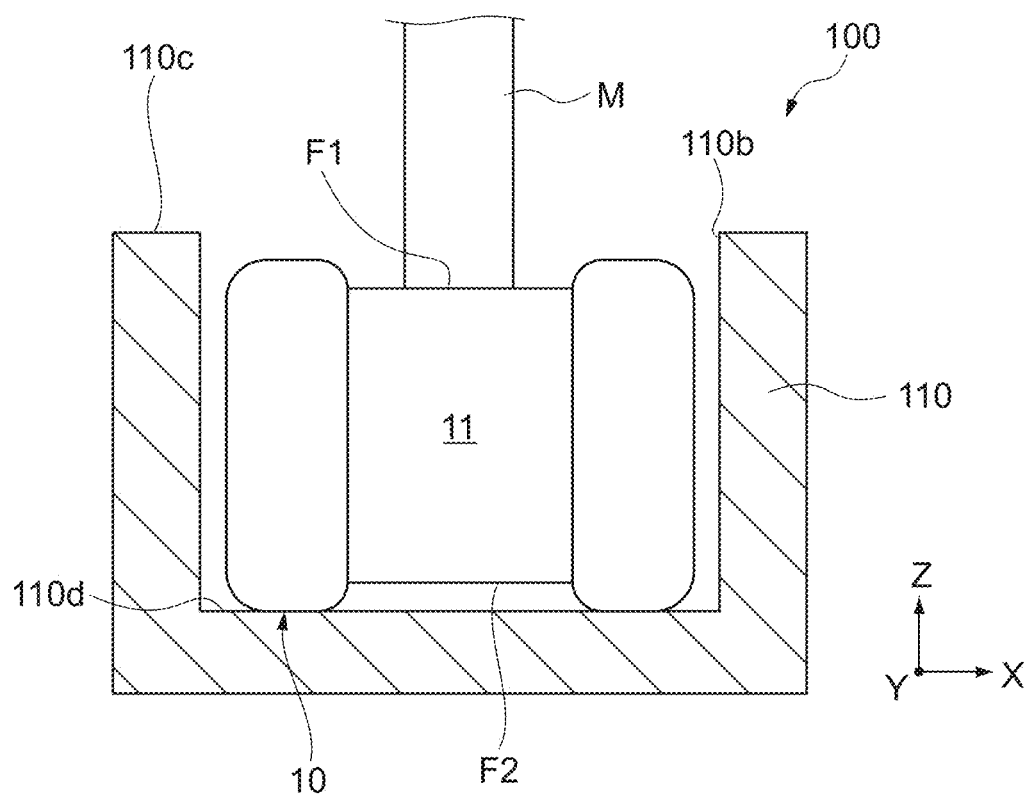
FIG. 15 is a cross-sectional view schematically showing a step of mounting the multi-layer ceramic capacitor.
Figure 16:
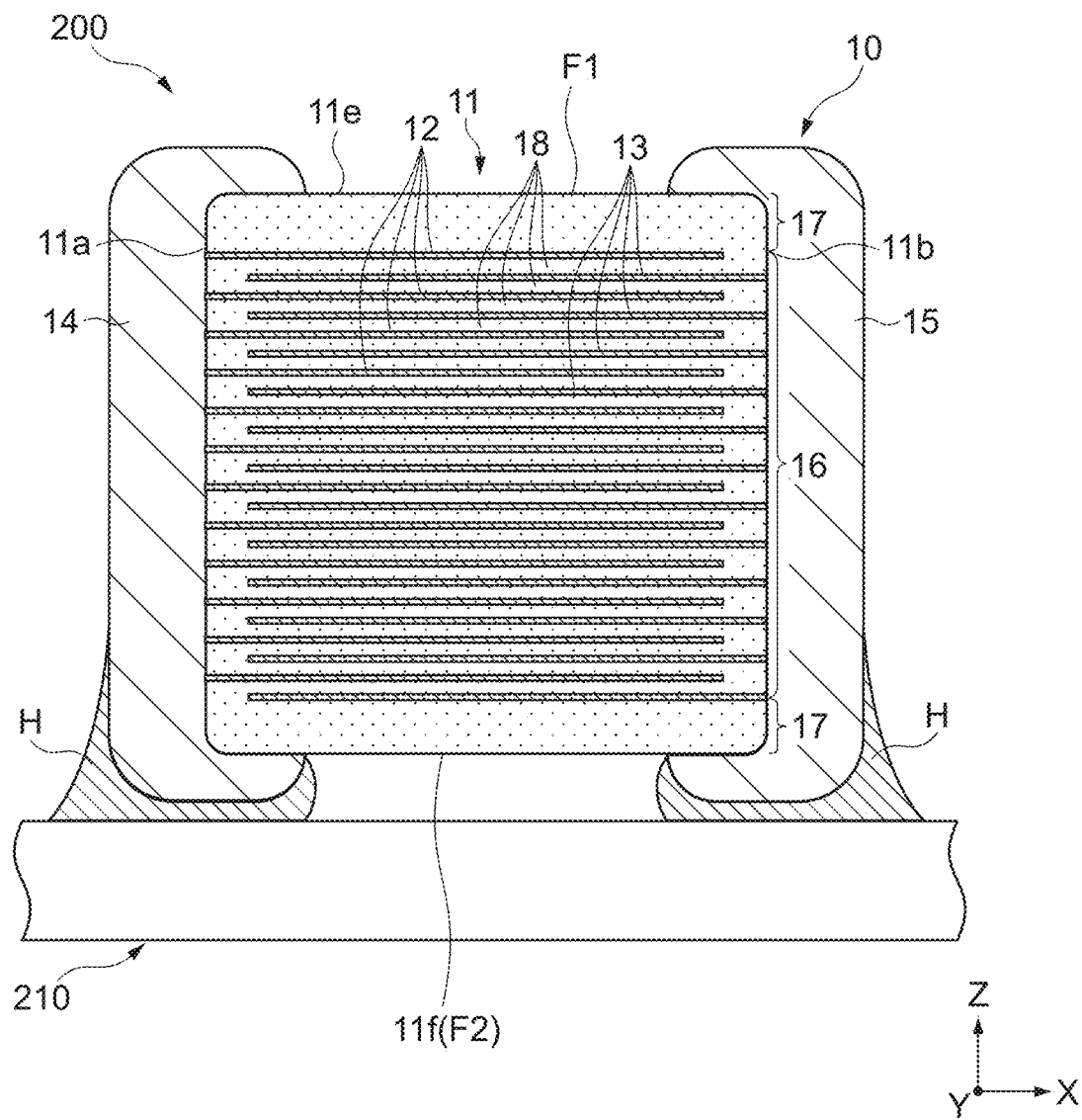
FIG. 16 is a cross-sectional view of a multi-layer ceramic capacitor mounting substrate according to an embodiment of the present disclosure.
Figure 17:
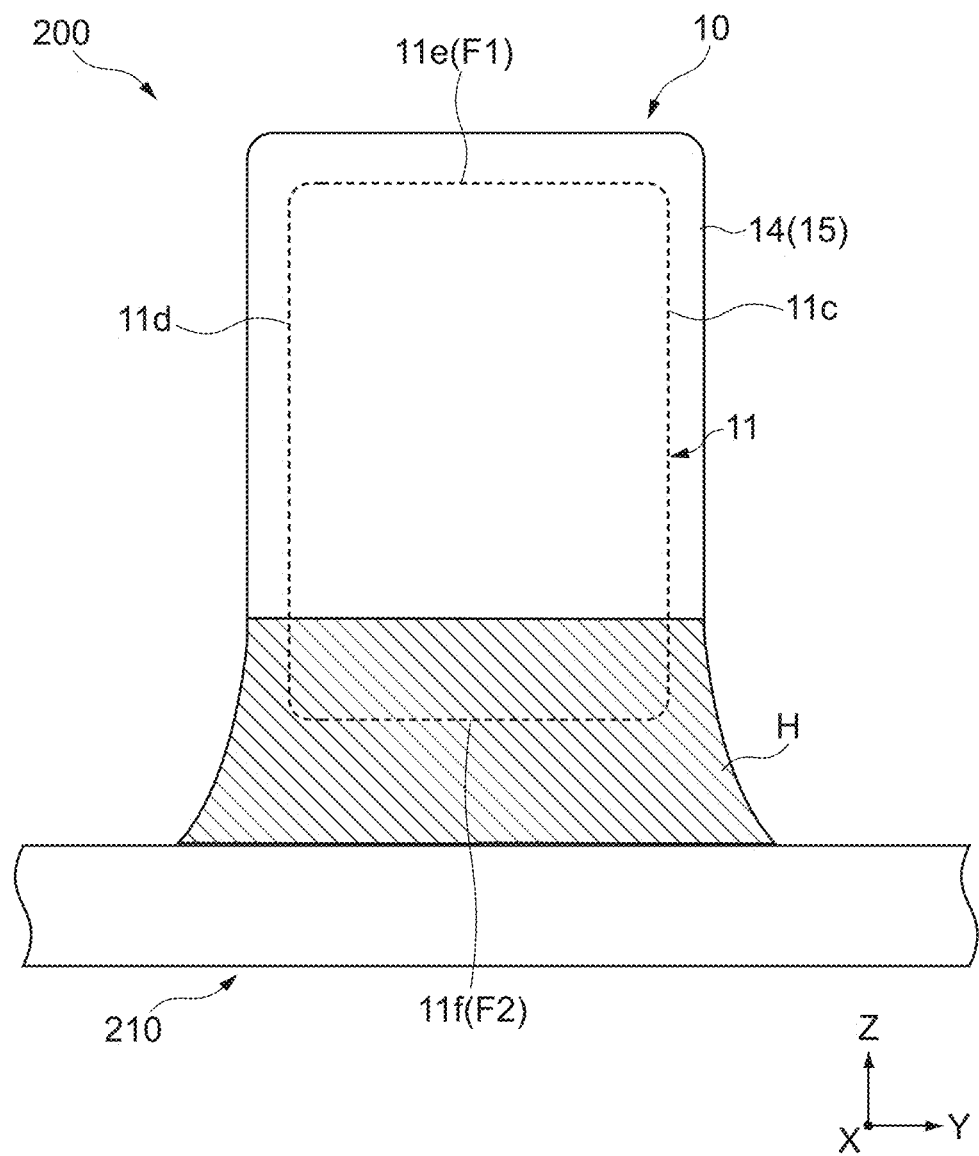
FIG. 17 is a side view of the multi-layer ceramic capacitor mounting substrate.

FIG. 15 is a cross-sectional view schematically showing a step of mounting the multi-layer ceramic capacitor 10, which shows a cross section corresponding to FIG. 14. FIG. 16 is a cross-sectional view of a multi-layer ceramic capacitor mounting substrate (mounting substrate) 200, onto which the multi-layer ceramic capacitor 10 is mounted, when viewed in the Y-axis direction. FIG. 17 is a side view of the mounting substrate 200 when viewed in the X-axis direction.

The multi-layer ceramic capacitors 10 are taken out of the package 100 one by one and are mounted onto a circuit board 210 of an electronic device. Hereinafter, description will be given with reference to FIGS. 15 and 17.

First, the sealing portion 120 is peeled off from the housing portion 110. Subsequently, as shown in FIG. 15, the multi-layer ceramic capacitor 10 is taken out through the take-out opening 110b of the package 100 by using a suction nozzle M of a chip mounter. The suction nozzle M holds the first flat region F1 by suction from above in the Z-axis direction, the first flat region F1 being faced to the take-out opening 110b side.

The suction nozzle M moves the multi-layer ceramic capacitor 10 onto the circuit board 210 while keeping suction of the first flat region F1. The suction nozzle M disposes the multi-layer ceramic capacitor 10 at a predetermined position on the circuit board 210, and then releases the suction. At that time as well, the first flat region F1 is faced upward in the Z-axis direction, and the second flat region F2 is faced downward in the Z-axis direction.

Subsequently, the first and second external electrodes 14 and 15 of the multi-layer ceramic capacitor 10 and the circuit board 210 are bonded to each other in the Z-axis direction by solder H or the like, and thus a mounting substrate 200 onto which the multi-layer ceramic electronic component 10 is mounted is formed as shown in FIGS. 16 and 17.

Also in the mounting substrate 200, the multi-layer ceramic capacitor 10 is mounted with the first flat region F1 being faced upward in the Z-axis direction and with the second flat region F2 being faced downward in the Z-axis direction. In other words, in the mounting substrate 200, the second flat region F2 faces the circuit board 210 in the Z-axis direction.

Figure 18:
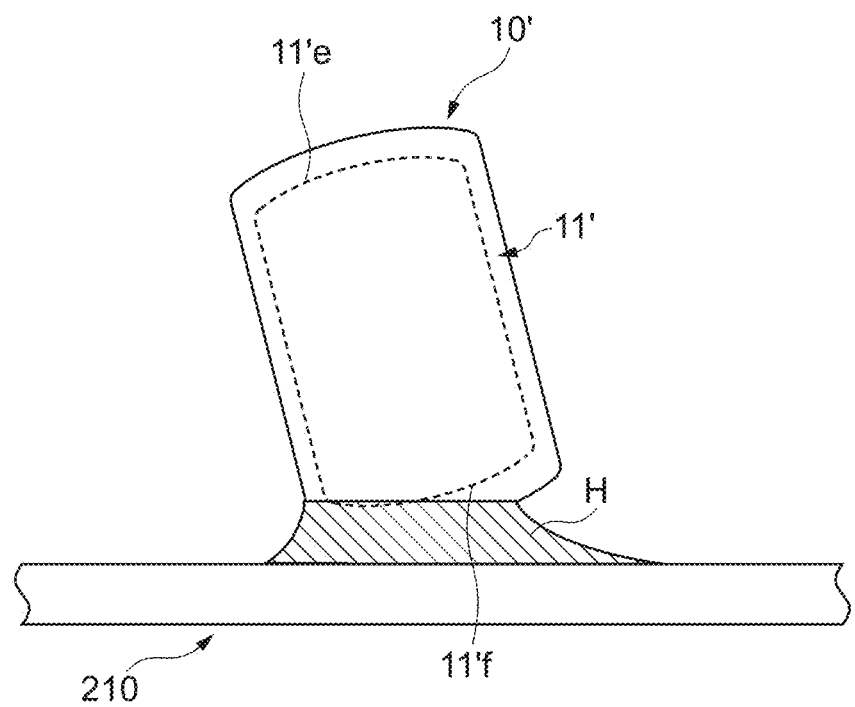
FIG. 18 is a side view of a multi-layer ceramic capacitor mounting substrate according to Comparative example of the embodiment.

Here, if the dielectric pattern is not formed to have the volume occupying 75% or more and less than 100% of the space portion, as in a multi-layer ceramic capacitor 10' shown in FIG. 18, the center portions of main surfaces 11'e and 11'f of a ceramic body 11' are curved surfaces. In this case, a gap is generated between the tip of the suction nozzle M and the main surface of the ceramic body, and the suction by the suction nozzle M becomes insufficient. Therefore, there is a possibility that a failure, such as the difficulty of performing suction of the main surface of the multi-layer ceramic capacitor or the drop of the multi-layer ceramic capacitor in the process of transfer, occurs in the mounting step. Alternatively, as shown in FIG. 18, there is a possibility that the multi-layer ceramic capacitor 10' loses balance when disposed on the circuit board 210, and the multi-layer ceramic capacitor 10' is bonded to the circuit board 210 at a large inclined angle.

In this embodiment, the first flat region F1 and the second flat region F2 are respectively formed on the main surfaces 11e and 11f of the ceramic body 11, and the multi-layer ceramic capacitor 10 is packaged with the first flat region F1 and the second flat region F2 being faced upward and downward in the Z-axis direction. Accordingly, the tip of the suction nozzle M and the first flat region F1 of the ceramic body 11 come into close contact with each other, and thus the suction nozzle M can stably perform suction of the first flat region F1. Therefore, it is possible to inhibit failures from occurring at the time of suction by the suction nozzle M and to smoothly mount the multi-layer ceramic capacitor 10.

Additionally, the second flat region F2 is formed in the main surface 11f on the circuit board 210 side, and thus the surfaces of the first and second external electrodes 14 and 15 facing the circuit board 210 are also formed to be substantially flat. Accordingly, the posture of the multi-layer ceramic capacitor 10 when bonded to the circuit board 210 by the solder H or the like can be stabilized, and the multi-layer ceramic capacitor 10 can be inhibited from being bonded to the circuit board 210 at an inclined angle. Therefore, on the circuit board 210, the multi-layer ceramic capacitor 10 can be inhibited from coming into contact with an adjacent electronic component, and the multi-layer ceramic capacitor 10 and another electronic component can be mounted at high density. Further, occurrence of a chip standing phenomenon (Tombstone phenomenon) in which one of the external electrodes separates from a land pattern of the circuit board can be suppressed, and failures can be more reliably inhibited from occurring at the time of mounting.

Figure 19:
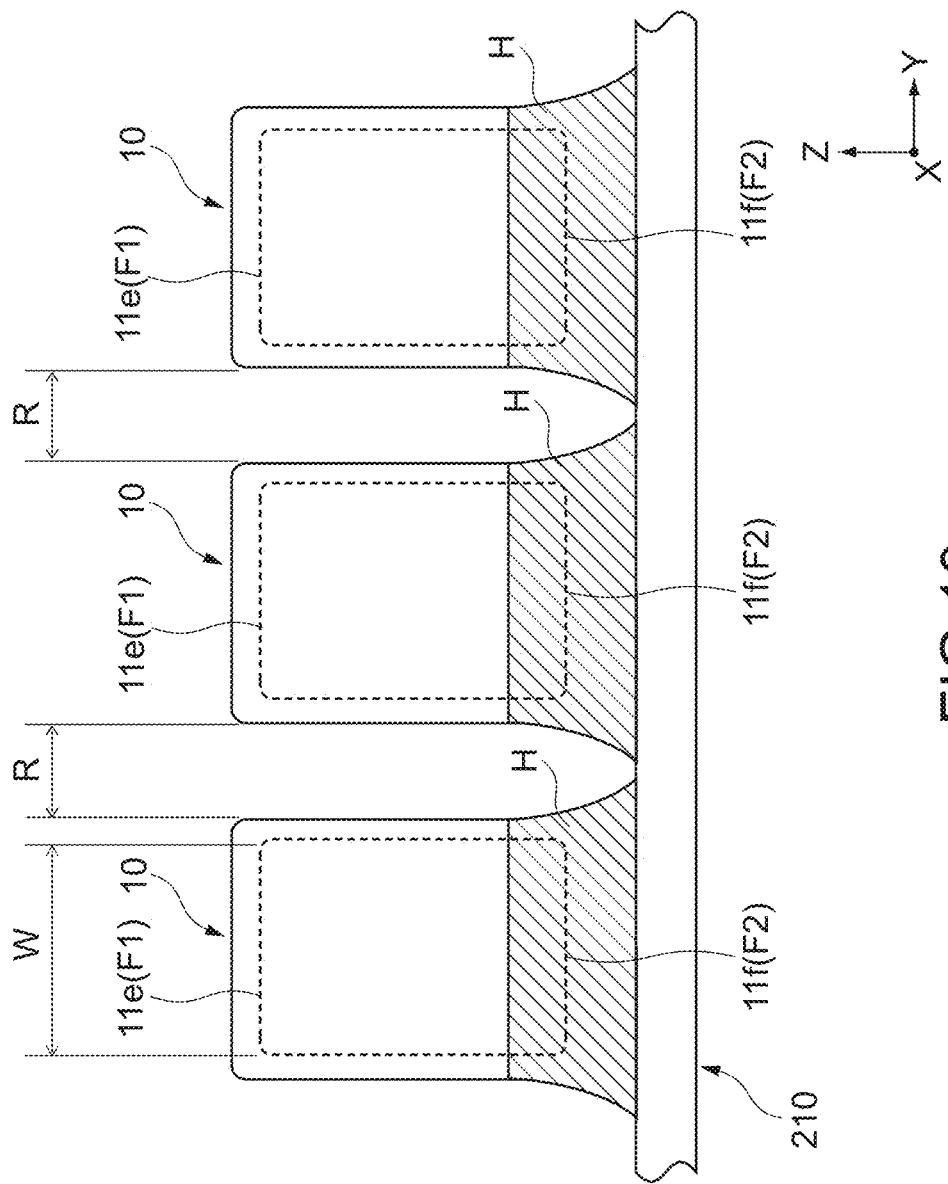
FIG. 19 is a view showing a configuration example of a multi-layer ceramic capacitor mounting substrate including a plurality of multi-layer ceramic capacitors.

FIG. 19 is a side view showing a configuration example of the mounting substrate 200 including a plurality of multi-layer ceramic capacitors 10 mounted onto the circuit board 210.

As shown in FIG. 19, in a case where a plurality of multi-layer ceramic capacitors 10 are disposed onto a single circuit board 210, the multi-layer ceramic capacitors 10 can be mounted along the Y-axis direction at intervals R, each of which is 30% or less of the width dimension W of the ceramic body 11. Accordingly, the plurality of multi-layer ceramic capacitors 10 can be mounted onto the circuit board 210 at high density, and a highly-functional and space-saving mounting substrate 200 can be achieved. It should be noted that the interval R is an interval of the narrowest portion between the multi-layer ceramic capacitors 10 adjacent to each other in the Y-axis direction.

Further, in the multi-layer ceramic capacitor 10, the height dimension T of the ceramic body 11 is set to be 1.1 times or more and 1.6 times or less the width dimension W thereof. Thus, the multi-layer ceramic capacitor 10 can keep the balance thereof even if the height dimension T is larger than the width dimension W. Accordingly, in the recess 110a of the package 100 or in the mounting step, the multi-layer ceramic capacitor 10 can be inhibited from falling down and can be handled at a posture at which the height direction of the multi-layer ceramic capacitor 10 coincides with the Z-axis direction. This also allows the multi-layer ceramic capacitor 10 to be smoothly mounted.

Additionally, setting the length dimension L of the ceramic body 11 to be larger than 1.0 times and equal to or smaller than 1.5 times the height dimension T also enables the balance of the ceramic body 11 to be kept. Therefore, handleability at the time of mounting of the multi-layer ceramic capacitor 10 can be more improved.

In such a manner, according to the multi-layer ceramic capacitor 10, a failure caused at the time of mounting can be inhibited from occurring even if the number of laminated first and second internal electrodes 12 and 13 is increased, and thus the capacitance can be increased without changing the mounting area. Therefore, it is possible to achieve the multi-layer ceramic capacitor 10 having a large capacitance and capable of contributing to reduction in size of the electronic device.

6. EXAMPLES AND COMPARATIVE EXAMPLES

As Examples and Comparative examples of this embodiment, samples of the multi-layer ceramic capacitor 10 were produced by the production method described above, and the shape, a suction rate of the suction nozzle M, and a mounting failure rate were investigated.

First, samples (Examples 1 to 3 and Comparative examples 1 and 2) of the multi-layer ceramic capacitor were produced. The samples had three sizes: a first size having a length dimension (L) of 0.69 mm, a width dimension (W) of 0.39 mm, and a height dimension (T) of 0.55 mm; a second size having a length dimension (L) of 1.15 mm, a width dimension (W) of 0.65 mm, and a height dimension (T) of 1.00 mm; and a third size having a length dimension (L) of 1.20 mm, a width dimension (W) of 0.75 mm, and a height dimension (T) of 0.85 mm. In other words, a ratio of the length dimension to the height dimension (L/T) was 1.15 to 1.41, and a ratio of the height dimension to the width dimension (T/W) was 1.13 to 1.54. Further, in the following evaluation, 100 samples for each of the three sizes for each of Examples and Comparative examples, i.e., 1,500 samples in total were used.

In each of the samples of Examples 1 to 3 and Comparative example 1, a dielectric pattern was formed. Table 1 shows a volume ratio of the dielectric pattern to the volume of the space portion (space occupancy rate), the volume of the space portion being obtained by multiplying the area of the electrode non-formation region by the thickness of the internal electrode pattern. It should be noted that a value of the space occupancy rate shown in Table 1 was a mean value of the 300 samples for each of Examples and Comparative examples.

The space occupancy rate was 95% in Example 1, 90% in Example 2, and 75% in Example 3, all of which were 75% or more and less than 100%. Meanwhile, in Comparative example 1, the space occupancy rate was 50%. In Comparative example 2, the space occupancy rate was 0% because the dielectric pattern was not formed.

TABLE 1

| | Space occupancy rate | Wf/W | Lf/L | Suction rate | Mounting failure rate |
|---|---|---|---|---|---|
| Example 1 | 95% | 85% | 92% | 99% | 1% |
| Example 2 | 90% | 83% | 90% | 99% | 1% |
| Example 3 | 75% | 82% | 89% | 99% | 1% |
| Comparative example 1 | 50% | 65% | 79% | 92% | 5% |
| Comparative example 2 | 0% | 35% | 65% | 85% | 9% |

Further, a proportion (Wf/W) of the width dimension (Wf) of one of the flat regions to the width dimension (W) of the multi-layer ceramic capacitor, and a proportion (Lf/L) of the length dimension (Lf) of the other flat region to the length dimension (L) of the multi-layer ceramic capacitor were measured. Table 1 shows the results of the measurement. It should be noted that a value of the proportion of the width dimension and a value of the proportion of the length dimension, which are shown in Table 1, were each a mean value of the 300 samples for each of Examples and Comparative examples. Further, for the value of the proportion of the width dimension in each sample, a value of the proportion of the width dimension of the flat region of an optional one of the two main surfaces of each sample was employed. For the value of the proportion of the length dimension in each sample, a value of the proportion of the length dimension of the flat region of the other main surface of each sample was employed.

The proportion of the width dimension was 85% in Example 1, 83% in Example 2, and 82% in Example 3, all of which were 80% or more in Examples 1 to 3. Meanwhile, the proportion of the width dimension was 65% in Comparative example 1, and 35% in Comparative example 2, all of which were less than 80%.

Further, the proportion of the length dimension was 92% in Example 1, 90% in Example 2, and 89% in Example 3, all of which were 80% or more in Examples 1 to 3. Meanwhile, the proportion of the length dimension was 79% in Comparative example 1, and 65% in Comparative example 2, all of which were less than 80%.

The proportion (Wf/W) of the width dimension and the proportion (Lf/L) of the length dimension each showed a positive relationship with the space occupancy rate of the dielectric pattern. Specifically, in Examples 1 to 3 in which the space occupancy rate was 75% or more and less than 100%, each of the Wf/W and the Lf/L was 80% or more in each example. However, in Comparative examples 1 and 2 in which the space occupancy rate was 50% or less, each of the Wf/W and the Lf/L was less than 80% in each example. From those results, it was confirmed that when the space occupancy rate of the dielectric pattern is set to 75% or more and less than 100%, the flat regions can be formed such that the proportion of the width dimension and the proportion of the length dimension are 80% or more.

Subsequently, a housing portion including recesses in a package was prepared, and each sample was housed in the recess with a main surface being faced to the take-out opening side, the main surface including a flat region having a larger proportion of the width dimension. The main surface of each sample on the take-out opening side was tried to be sucked by a suction nozzle of a chip mounter. In the 300 samples of each of Examples and Comparative Examples, a proportion of the samples whose main surfaces could be sucked by the suction nozzle was calculated as a "suction rate". Table 1 shows the results thereof.

As shown in Table 1, it was confirmed that the suction rate is 99% in all of Examples 1 to 3, and almost all of the samples can be sucked by the suction nozzle and have optimal handleability at the time of mounting. Meanwhile, the suction rate was 92% in Comparative example 1 and 85% in Comparative example 2, in which the suction failed in approximately 10 to 20% of the samples. Accordingly, it was confirmed that the handleability at the time of mounting in Comparative examples 1 and 2 is inferior to that in Examples 1 to 3.

Next, solder cream was printed on land patterns provided on the circuit board at intervals of 20% of the width dimension. The samples that could be sucked by the suction nozzle were disposed on the land patterns, and soldering was performed in a reflow furnace. In each of Examples and Comparative Examples, a proportion of samples, in which contact with adjacent components or separation from one of the land patterns due to the Tombstone phenomenon was confirmed, to the samples that could be sucked by the suction nozzle and disposed onto a circuit board, was calculated as a "mounting failure rate". Table 1 shows the results thereof.

As shown in Table 1, it was confirmed that the mounting failure rate is 1% in all of Examples 1 to 3, and good mounting is enabled in almost all of the samples. On the other hand, a mounting failure occurred and was 5% in Comparative example 1 and 9% in Comparative example 2. Accordingly, it was confirmed that the handleability at the time of mounting in Comparative examples 1 and 2 is inferior to that in Examples 1 to 3.

7. Other Embodiments

Hereinabobve, the embodiment of the present disclosure has been described, but the present disclosure is not limited to the embodiment described above, and it should be appreciated that the present disclosure may be variously modified without departing from the gist of the present disclosure. For example, the embodiment of the present disclosure can be an embodiment in which some embodiments are combined.

For example, in the multi-layer ceramic capacitor 10, the multi-layer unit 16 may be divided into a plurality of multi-layer units 16 and then disposed in the Z-axis direction. In this case, in each multi-layer unit 16, the first and second internal electrodes 12 and 13 only need to be alternately disposed along the Z-axis direction, and the first internal electrodes 12 or the second internal electrodes 13 may be consecutively disposed at portions where the multi-layer units 16 are adjacent to each other.

Further, in the embodiment described above, the multi-layer ceramic capacitor has been described as an example of a ceramic electronic component, but the present disclosure can be applied to any other multi-layer ceramic electronic components in which paired internal electrodes are alternately disposed. Examples of such multi-layer ceramic electronic components include a piezoelectric element

What is claimed is:

1. A method of producing a multi-layer ceramic electronic component, comprising:
   forming an internal electrode pattern having a predetermined thickness on each unsintered ceramic sheet of a plurality of unsintered ceramic sheets, each unsintered ceramic sheet comprising an electrode non-formation region where the internal electrode pattern is absent;
   forming a dielectric pattern on each unsintered ceramic sheet of the plurality of unsintered ceramic sheets having the internal electrode pattern fowled thereon, the dielectric pattern being formed only in the respective electrode non-formation region of each unsintered ceramic sheet such that the dielectric pattern occupies 75% or more and less than 100% of the electrode non-formation region;
   laminating in a first direction the plurality of unsintered ceramic sheets, the internal electrode pattern and the dielectric pattern being formed on each unsintered ceramic sheet of the plurality of unsintered ceramic sheets, and thereby forming an unsintered multi-layer body;
   cutting the unsintered multi-layer body, thereby forming an unsintered ceramic body including a plurality of internal electrodes laminated in the first direction;
   sintering the unsintered ceramic body to form a sintered ceramic body; and
   forming a pair of external electrodes that are connected to the plurality of internal electrodes and face each other in a second direction orthogonal to the first direction,
   a dimension of the sintered ceramic body in the first direction being 1.1 times or more and 1.6 times or less a dimension of the sintered ceramic body in a third direction orthogonal to the first direction and the second direction,
   wherein the internal electrode pattern on each unsintered ceramic sheet of the plurality of unsintered ceramic sheets comprises a first column of internal electrodes and a second column of internal electrodes that are displaced, in the second direction, by one chip compared to the internal electrodes in the first column.

2. The method of producing a multi-layer ceramic electronic component according to claim 1, wherein the unsintered ceramic body further includes a first main surface including a first flat region facing in the first direction, and a second main surface including a second flat region, the second flat region being on a side opposite to the first flat region and facing in the first direction,
 wherein the first flat region is formed at a center portion of the first main surface in the second direction, and
 wherein the second flat region is formed at a center portion of the second main surface in the third direction.

3. The method of producing a multi-layer ceramic electronic component according to claim 2, wherein a dimension of the first flat region in the third direction is 80% or more and less than 100% of the dimension of the unsintered ceramic body in the third direction.

4. The method of producing a multi-layer ceramic electronic component according to claim 2, wherein a dimension of the second flat region in the second direction is 80% or more and less than 100% of a dimension of the unsintered ceramic body in the second direction.

5. The method of producing a multi-layer ceramic electronic component according to claim 2, wherein
 when a first imaginary line and a second imaginary line are defined on a cross section of the sintered ceramic body in the first direction and the third direction, the first imaginary line passing through a center point of the first main surface in the third direction and orthogonally intersecting with the first direction, the second imaginary line being parallel to the first imaginary line and having an interval from the first imaginary line, the interval being 1% of the dimension of the sintered ceramic body in the first direction, the first flat region includes a region between two points at which the second imaginary line and the first main surface intersect with each other, and
 when a third imaginary line and a fourth imaginary line are defined on a cross section of the sintered ceramic body in the first direction and the second direction, the third imaginary line passing through a center point of the second main surface in the second direction and orthogonally intersecting with the first direction, the fourth imaginary line being parallel to the third imaginary line and having an interval from the third imaginary line, the interval being 1% of the dimension of the sintered ceramic body in the first direction, the second flat region includes a region between two points at which the fourth imaginary line and the second main surface intersect with each other.

6. The method of producing a multi-layer ceramic electronic component according to claim 1, wherein the dimension of the sintered ceramic body in the second direction is larger than 1.0 times and equal to or smaller than 1.5 times the dimension of the sintered ceramic body in the first direction.

7. The method of producing a multi-layer ceramic electronic component according to claim 1, wherein the plurality of unsintered ceramic sheets includes first unsintered ceramic sheets each having first internal electrode patterns, and second unsintered ceramic sheets each having second internal electrode patterns,
 wherein the first unsintered ceramic sheets and the sheets unsintered ceramic sheets are alternately laminated, and
 wherein the second internal electrode patterns are displaced from the first internal electrode patterns by one chip in the second direction or the third direction.

* * * * *